US009119283B2

(12) United States Patent
Albarede

(10) Patent No.: US 9,119,283 B2
(45) Date of Patent: Aug. 25, 2015

(54) CHAMBER MATCHING FOR POWER CONTROL MODE

(71) Applicant: Lam Research Corporation, Fremont, CA (US)

(72) Inventor: Luc Albarede, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 189 days.

(21) Appl. No.: 13/901,509

(22) Filed: May 23, 2013

(65) Prior Publication Data
US 2014/0265851 A1    Sep. 18, 2014

Related U.S. Application Data

(60) Provisional application No. 61/784,086, filed on Mar. 14, 2013.

(51) Int. Cl.
| | | |
|---|---|---|
| *H01J 7/24* | (2006.01) | |
| *H05H 1/46* | (2006.01) | |
| *H01J 37/32* | (2006.01) | |

(52) U.S. Cl.
CPC ............ *H05H 1/46* (2013.01); *H01J 37/32183* (2013.01); *H01J 37/32899* (2013.01); *H05H 2001/4682* (2013.01)

(58) Field of Classification Search
CPC ....................................................... H01J 37/32
See application file for complete search history.

(56) References Cited

U.S. PATENT DOCUMENTS

| 4,377,961 A | 3/1983 | Bode |
|---|---|---|
| 4,420,790 A | 12/1983 | Golke et al. |

(Continued)

FOREIGN PATENT DOCUMENTS

| JP | 2001-127045 A | 5/2001 |
|---|---|---|
| JP | 2004239211 A | 8/2004 |

(Continued)

OTHER PUBLICATIONS

Lars Christoph Comparison of Applied Materials DPS chambers used for poly-Si Etch process by plasma parameters Jun. 12, 2000 2nd workshop on Self excited electron plasma resonance spectroscopy Dredsen Germany.*

(Continued)

*Primary Examiner* — Douglas W Owens
*Assistant Examiner* — Srinivas Sathiraju
(74) *Attorney, Agent, or Firm* — Martine Penilla Group, LLP

(57) ABSTRACT

Systems and methods for performing chamber matching are described. One of the methods for performing chamber matching includes executing a first test within a first plasma chamber to measure a variable and executing a second test within a second plasma chamber to measure the variable. The first and second tests are executed based on one recipe. The method further includes determining a first relationship between the variable measured with the first test and power provided during the first test, determining a second relationship between the variable measured with the second test and power provided during the second test, and identifying power adjustment to apply to the second plasma chamber during a subsequent processing operation based on the first and second relationships. The power adjustment causes the second plasma chamber to perform the processing operation in a processing condition determined using the first plasma chamber.

24 Claims, 8 Drawing Sheets

(56) References Cited

U.S. PATENT DOCUMENTS

| | | | |
|---|---|---|---|
| 4,454,001 A | 6/1984 | Stemheim et al. | |
| 4,500,563 A | 2/1985 | Ellenberger et al. | |
| 5,474,548 A | 12/1995 | Knopp et al. | |
| 5,479,340 A | 12/1995 | Fox et al. | |
| 5,556,549 A | 9/1996 | Patrick et al. | |
| 5,571,366 A * | 11/1996 | Ishii et al. | 156/345.26 |
| 5,689,215 A | 11/1997 | Richardson et al. | |
| 5,694,207 A | 12/1997 | Hung et al. | |
| 5,737,177 A | 4/1998 | Mett et al. | |
| 5,764,471 A | 6/1998 | Burkhart | |
| 5,788,801 A | 8/1998 | Barbee et al. | |
| 5,810,963 A | 9/1998 | Tomioka | |
| 5,812,361 A | 9/1998 | Jones et al. | |
| 5,866,985 A | 2/1999 | Coultas et al. | |
| 5,889,252 A | 3/1999 | Williams et al. | |
| 5,892,198 A | 4/1999 | Barnes et al. | |
| 5,894,400 A | 4/1999 | Graven et al. | |
| 5,980,767 A | 11/1999 | Koshimizu et al. | |
| 5,989,999 A * | 11/1999 | Levine et al. | 438/627 |
| 6,020,794 A | 2/2000 | Wilbur | |
| 6,021,672 A | 2/2000 | Lee | |
| 6,042,686 A | 3/2000 | Dible et al. | |
| 6,048,435 A | 4/2000 | DeOrnellas et al. | |
| 6,110,214 A | 8/2000 | Klimasauskas | |
| 6,157,867 A * | 12/2000 | Hwang et al. | 700/121 |
| 6,198,616 B1 | 3/2001 | Dahimene et al. | |
| 6,246,972 B1 | 6/2001 | Klimasauskas | |
| 6,472,822 B1 | 10/2002 | Chen et al. | |
| 6,522,121 B2 | 2/2003 | Coumou | |
| 6,535,785 B2 | 3/2003 | Johnson et al. | |
| 6,597,002 B1 | 7/2003 | Kondo | |
| 6,669,783 B2 | 12/2003 | Sexton et al. | |
| 6,677,246 B2 | 1/2004 | Scanlan et al. | |
| 6,750,711 B2 | 6/2004 | Chawla et al. | |
| 6,781,317 B1 * | 8/2004 | Goodman | 315/111.21 |
| 6,823,815 B2 | 11/2004 | Han et al. | |
| 6,838,635 B2 | 1/2005 | Hoffman et al. | |
| 6,862,557 B2 | 3/2005 | Jones et al. | |
| 6,873,114 B2 | 3/2005 | Avoyan et al. | |
| 6,972,524 B1 | 12/2005 | Marakbtanov et al. | |
| 6,983,215 B2 | 1/2006 | Coumou et al. | |
| 7,042,311 B1 | 5/2006 | Hilliker et al. | |
| 7,122,965 B2 * | 10/2006 | Goodman | 315/111.21 |
| 7,169,625 B2 | 1/2007 | Davis et al. | |
| 7,323,116 B2 | 1/2008 | Guiney et al. | |
| 7,359,177 B2 | 4/2008 | Yang et al. | |
| 7,375,038 B2 | 5/2008 | Kumar | |
| 7,435,926 B2 * | 10/2008 | Jafarian-Tehrani | 219/121.59 |
| 7,459,100 B2 | 12/2008 | Kiemasz et al. | |
| 7,480,571 B2 | 1/2009 | Howald et al. | |
| 7,505,879 B2 | 3/2009 | Tomoyasu et al. | |
| 7,728,602 B2 | 6/2010 | Valcore et al. | |
| 7,764,140 B2 * | 7/2010 | Nagarkatti et al. | 333/17.3 |
| 7,768,269 B2 | 8/2010 | Pipitone et al. | |
| 7,858,898 B2 | 12/2010 | Bailey, III et al. | |
| 7,967,944 B2 | 6/2011 | Shannon et al. | |
| 8,040,068 B2 | 10/2011 | Coumou et al. | |
| 8,080,168 B2 | 12/2011 | Cirigliano | |
| 8,080,760 B2 | 12/2011 | Dhindsa et al. | |
| 8,103,492 B2 * | 1/2012 | Brcka | 703/6 |
| 8,264,238 B1 | 9/2012 | El-Chouelry | |
| 8,271,121 B2 | 9/2012 | Venugopal et al. | |
| 8,368,308 B2 | 2/2013 | Banna et al. | |
| 8,404,598 B2 | 3/2013 | Liao et al. | |
| 8,501,631 B2 | 8/2013 | Valcore et al. | |
| 8,901,935 B2 | 12/2014 | Valcore et al. | |
| 2003/0082835 A1 | 5/2003 | McChesney et al. | |
| 2003/0103793 A1 | 6/2003 | Murakoshi et al. | |
| 2004/0028837 A1 | 2/2004 | Fink | |
| 2004/0045506 A1 | 3/2004 | Chen et al. | |
| 2004/0060660 A1 * | 4/2004 | Klimecky et al. | 156/345.28 |
| 2004/0061448 A1 | 4/2004 | Avoyan et al. | |
| 2004/0087047 A1 | 5/2004 | Jaiswal et al. | |
| 2004/0107906 A1 | 6/2004 | Collins et al. | |
| 2004/0135590 A1 | 7/2004 | Quon | |
| 2004/0222184 A1 | 11/2004 | Hayami et al. | |
| 2004/0226657 A1 | 11/2004 | Hoffman | |
| 2005/0057165 A1 * | 3/2005 | Goodman | 315/111.51 |
| 2005/0090118 A1 | 4/2005 | Shannon et al. | |
| 2005/0133163 A1 | 6/2005 | Shannon et al. | |
| 2005/0134186 A1 | 6/2005 | Brouk et al. | |
| 2005/0151479 A1 | 7/2005 | Avoyan et al. | |
| 2005/0217797 A1 * | 10/2005 | Jafarian-Tehrani | 156/345.28 |
| 2005/0241762 A1 | 11/2005 | Paterson et al. | |
| 2005/0252884 A1 | 11/2005 | Lam et al. | |
| 2006/0065623 A1 | 3/2006 | Guiney et al. | |
| 2006/0065631 A1 | 3/2006 | Cheng et al. | |
| 2006/0065632 A1 | 3/2006 | Cheng et al. | |
| 2006/0088655 A1 | 4/2006 | Collins et al. | |
| 2006/0100824 A1 | 5/2006 | Moriya | |
| 2006/0169582 A1 | 8/2006 | Brown et al. | |
| 2006/0231526 A1 | 10/2006 | Donohue | |
| 2006/0232471 A1 | 10/2006 | Coumou | |
| 2007/0021935 A1 | 1/2007 | Larson et al. | |
| 2007/0065594 A1 | 3/2007 | Chiang et al. | |
| 2007/0247074 A1 | 10/2007 | Paterson et al. | |
| 2007/0252580 A1 | 11/2007 | Dine et al. | |
| 2007/0262723 A1 | 11/2007 | Ikenouchi | |
| 2009/0151871 A1 | 6/2009 | Pease et al. | |
| 2009/0284156 A1 | 11/2009 | Banna et al. | |
| 2009/0294061 A1 | 12/2009 | Shannon et al. | |
| 2009/0295296 A1 | 12/2009 | Shannon et al. | |
| 2010/0099266 A1 | 4/2010 | Oswald et al. | |
| 2010/0270141 A1 | 10/2010 | Carter et al. | |
| 2010/0332201 A1 * | 12/2010 | Albarede et al. | 703/2 |
| 2011/0031216 A1 | 2/2011 | Liao et al. | |
| 2011/0097901 A1 | 4/2011 | Banna et al. | |
| 2011/0115492 A1 | 5/2011 | Valcore, Jr. et al. | |
| 2011/0118863 A1 | 5/2011 | Valcore, Jr. | |
| 2011/0137446 A1 | 6/2011 | Valcore, Jr. et al. | |
| 2012/0073754 A1 | 3/2012 | De la Llera et al. | |
| 2012/0187844 A1 * | 7/2012 | Hoffman et al. | 315/111.51 |
| 2012/0262064 A1 * | 10/2012 | Nagarkatti et al. | 315/111.21 |
| 2014/0062303 A1 * | 3/2014 | Hoffman et al. | 315/111.21 |

FOREIGN PATENT DOCUMENTS

| | | |
|---|---|---|
| JP | 2004-335594 A | 11/2004 |
| JP | 2005130198 A | 5/2005 |
| JP | 2005284046 A | 10/2005 |
| KR | 10-2005-0088438 A | 9/2005 |
| KR | 10-2005-0089995 A | 9/2005 |
| KR | 10-2007-0031915 A | 3/2007 |
| WO | 2008002938 A2 | 1/2008 |
| WO | 2012054306 A2 | 4/2012 |

OTHER PUBLICATIONS

Christoph Steuer TOOL Comparison at GC stack Etch in LAM TCP Using Plasma Parameters (SEERS) Dec. 12, 2000 $2^{nd}$ workshop on self excited electron plasma resonance Sepectroscopy Germany.*

Thorsten, Lill et al., "Controlling Ion Energy Within a Plasma Chamber", U.S. Appl. No. 13/930,138, filed Jun. 28, 2013.

Electromagnetic Waves and Antennas, Sophocles J. Orfanidis, Rutgers University, Aug. 25, 2013, Chapter 10.10.

Darnon et al., "Synchronous Pulsed Plasma for Silicon Etch Applications", ECS Transactions, 27 (1) pp. 717-723 (2010), Publication by: The Electrochemical Society.

PCT/US2010/057478 International Search Report and Written Opinion, mailed Jul. 26, 2011 (6 pages).

PCT/US2011/063422 International Search Report and Written Opinion, mailed Mar. 28, 2012 (9 pages).

PCT/US2010/057450 International Search Report and Written Opinion, mailed Jul. 18, 2011 (9 pages).

PCT/IB2013/051010 International Search Report and Written Opinion, mailed Jul. 3, 2013 (13 pages).

* cited by examiner

| RECIPE | Chamber 1 1st Condition | | Chamber 1 2nd Condition | | Chamber 1 3rd Condition | |
|---|---|---|---|---|---|---|
| Pressure | 0.1 | | 0.1 | | 0.1 | |
| Power | 5 | 10 | 5 | 10 | 5 | 10 |
| | 15 | 20 | 15 | 20 | 15 | 20 |
| Temp. | 40 | | 40 | | 40 | |
| Freq. | 28 | | 28 | | 28 | |
| Gap | 2 cm | | 2 cm | | 2 cm | |

FIG. 8

CHAMBER MATCHING FOR POWER CONTROL MODE

CLAIM OF PRIORITY

This application claims the benefit of and priority to, under 35 U.S.C. 119§(e), to U.S. Provisional Patent Application No. 61/784,086, filed on Mar. 14, 2013, and titled "Chamber Matching Using a Power Control Mode", which is hereby incorporated by reference in its entirety.

FIELD

The present embodiments relate to chamber matching using a power control mode.

BACKGROUND

Plasma chambers are used for a variety of purposes. For example, plasma is generated within a plasma chamber to etch a substrate, clean a substrate, deposit layers on the substrate, or perform other processes on the substrate.

Various chambers are used to process the substrate. Also, the same chamber is used to process the substrate. When different chambers are used, the substrate may not be processed in a substantially uniform manner. For example, a substrate etched using one plasma chamber may be etched at a different rate than another substrate that is etched using another plasma chamber. As another example, a substantially higher amount of material may be deposited on a substrate processed in a plasma chamber than that deposited on the substrate in another plasma chamber.

It is in this context that embodiments described in the present disclosure arise.

SUMMARY

Embodiments of the disclosure provide apparatus, methods and computer programs for chamber matching using a power control mode. It should be appreciated that the present embodiments can be implemented in numerous ways, e.g., a process, an apparatus, a system, a device, or a method on a computer-readable medium. Several embodiments are described below.

In some embodiments, a method for performing chamber-to-chamber matching is described. The method includes executing a first test within a first plasma chamber to measure a variable and executing a second test within a second plasma chamber to measure the variable. The first and second tests are executed based on one recipe. The method further includes determining a first relationship between the variable measured with the first test and power provided during the first test, determining a second relationship between the variable measured with the second test and power provided during the second test, and identifying power adjustment to apply to the second plasma chamber during a subsequent processing operation based on the first and second relationships. The power adjustment causes the second plasma chamber to perform the processing operation in a processing condition determined using the first plasma chamber.

In various embodiments, a method for performing intra-chamber matching is described. The method includes executing a first test to measure a variable associated with a plasma chamber. The plasma chamber is in a first condition during execution of the first test. The method further includes executing a second test to measure the variable associated with the plasma chamber. The plasma chamber is in a second condition during execution of the second test. The method includes determining a first relationship between the variable measured using the first test and power provided during the first test, determining a second relationship between the variable measured using the second test and power provided during the second test, and identifying power adjustment to apply to the plasma chamber during a subsequent processing operation based on the first and second relationships. The power adjustment causes the plasma chamber to perform the processing operation in a processing condition. The processing condition is determined when the plasma chamber is in the first condition.

In several embodiments, a plasma system for performing chamber-to-chamber matching is described. The plasma system includes a first plasma chamber used to execute a first test to measure a variable, a radio frequency (RF) transmission line coupled to the first plasma chamber for communicating an RF signal to the first plasma chamber, and an impedance matching circuit coupled to the RF transmission line. The plasma system further includes an RF generator coupled to the impedance matching circuit for supplying the RF signal and a second plasma chamber used to execute a second test to measure the variable. The first and second tests are executed based on one recipe. The second test is executed after decoupling the first plasma chamber from the RF transmission line and coupling the second plasma chamber to the RF transmission line. The plasma system includes a host system further including a processor. The host system is coupled to the RF generator. The processor is configured to determine a first relationship between the variable measured with the first test and power provided during the first test, determine a second relationship between the variable measured with the second test and power provided during the second test, and identify power adjustment to apply to the second plasma chamber during a subsequent processing operation based on the first and second relationships. The power adjustment causes the second plasma chamber to perform the processing operation in a processing condition determined using the first plasma chamber.

In a number of embodiments, a plasma system for performing intra-chamber matching is described. The plasma system includes a plasma chamber used to execute a first test to measure a variable. The plasma chamber is in a first condition during execution of the first test. The plasma chamber is used to execute a second test to measure the variable. Also, the plasma chamber is in a second condition during execution of the second test. The plasma system further includes a radio frequency (RF) transmission line coupled to the plasma chamber for communicating an RF signal to the plasma chamber. The plasma system further includes an impedance matching circuit coupled to the RF transmission line, an RF generator coupled to the impedance matching circuit for supplying the RF signal, and a host system including a processor, the host system coupled to the RF generator. The processor is configured to determine a first relationship between the variable measured using the first test and power provided during the first test, determine a second relationship between the variable measured using the second test and power provided during the second test, and identify power adjustment to apply to the plasma chamber during a subsequent processing operation based on the first and second relationships. The power adjustment causes the plasma chamber to perform the processing operation in a processing condition. The processing condition is determined when the plasma chamber is in the first condition.

In some embodiments, a first relationship between a function of a variable, e.g., voltage, current, etc., and power is generated. The variable is measured from a gap inside a plasma chamber and the power is power supplied to an electrode of the plasma chamber or power delivered to the electrode. Moreover, a second relationship between a function of a variable and power is generated. The second relationship may be generated using the same plasma chamber as that used to generate the first relationship or another plasma chamber than the plasma chamber used to generate the first relationship. The second relationship is compared with the first relationship to determine a difference between the first and second relationships. The difference is reduced to achieve the first relationship from the second relationship or to achieve the second relationship from the first relationship. For example, same amount of power provided to a plasma chamber that is used to generate the first relationship is provided to another plasma chamber that is used to generate the second relationship. As another example, power provided to a plasma chamber that is used to generate the first relationship is modified to achieve the second relationship. In this example, both the first and second relationships are generated using the same plasma chamber.

Some advantages of the above-described embodiments include performing chamber-to-chamber matching or intra-chamber matching using a power control mode. For example, when the first relationship is modified to achieve the second relationship, the plasma chamber used to generate the first relationship is operated to achieve the second relationship. When the plasma chamber used to generate the first relationship is operated to achieve the second relationship, a substantial amount of uniformity is achieved in processing a wafer in the plasma chambers that are used to generate the first and second relationships.

Moreover, a condition of a plasma chamber used to generate the first relationship may change over time. As a result of a change in the condition, the plasma chamber used to generate the first relationship may produce different results that are visible on wafers. For example, when a wafer is cleaned in a plasma chamber used to generate the first relationship, the cleaning process changes a condition of the plasma chamber. After the cleaning, when the plasma chamber used to generate the first relationship is used to clean another wafer, the other wafer may not be cleaned to the same extent, e.g., level, aspect ratio, etc., as that of the wafer cleaned before the other wafer. The variation in processing wafers over time results in a radio frequency (RF) transmission line that is coupled the plasma chamber used to generate the first relationship experiencing different losses over time of RF power communicated over the transmission line. The modification of the first relationship to achieve the second relationship in the plasma chamber used to generate the first relationship has an advantage of reducing the non-uniformity in processing of wafers. When the modification is performed, the difference in the losses is compensated for.

Other aspects will become apparent from the following detailed description, taken in conjunction with the accompanying drawings.

BRIEF DESCRIPTION OF THE DRAWINGS

The embodiments may best be understood by reference to the following description taken in conjunction with the accompanying drawings.

FIG. 8 shows a recipe for performing intra-chamber matching, in accordance with an embodiment described in the present disclosure.

DETAILED DESCRIPTION

The following embodiments describe systems and methods for chamber matching using a power control mode. It will be apparent that the present embodiments may be practiced without some or all of these specific details. In other instances, well known process operations have not been described in detail in order not to unnecessarily obscure the present embodiments.

Figure 1:
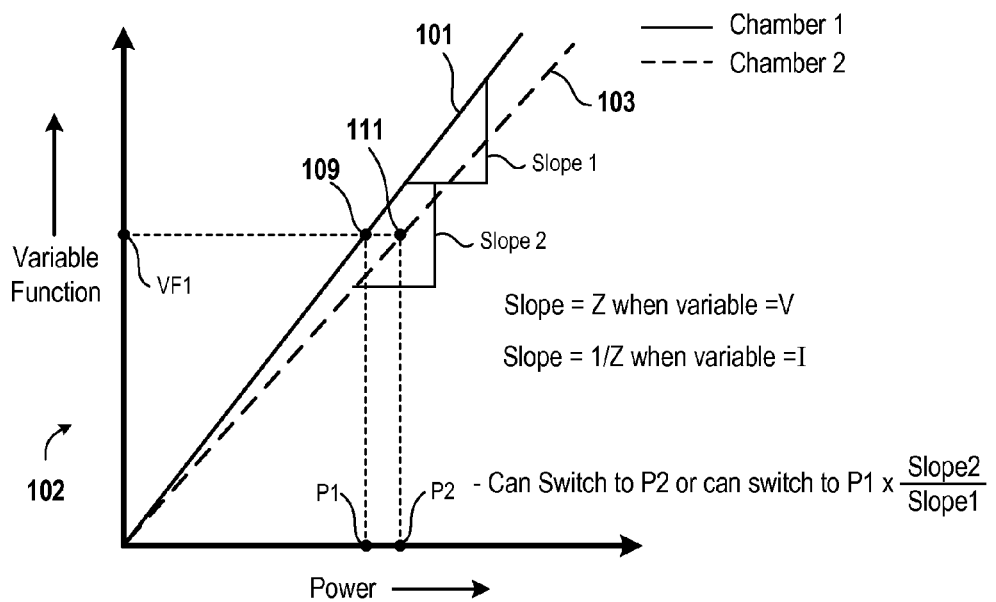
FIG. 1 is a diagram of a graph for illustrating chamber-to-chamber matching using a power control mode, in accordance with an embodiment described in the present disclosure.

FIG. 1 is a diagram of an embodiment of a graph 102 for illustrating chamber-to-chamber matching using a power control mode. In chamber-to-chamber matching using a power control mode, a relationship between a function of a variable measured using a plasma chamber 1 and power associated with the plasma chamber 1 is determined. Also, a relationship between a function of the variable measured using a plasma chamber 2 and power associated with the plasma chamber 2 is determined.

Examples of the variable include current, voltage, reflection coefficient, etc. Examples of the function of the variable include a square of the variable, a square root of the variable, a mathematical power function of the variable, etc.

In some embodiments, the plasma chamber 2 has the same structure as that of the plasma chamber 1. For example, the plasma chamber 2 includes elements that have same dimensions as that of corresponding elements in the plasma chamber 1. As another example, the plasma chamber 2 includes elements that are of the same type as that of corresponding elements in the plasma chamber 1. To illustrate, a transformer coupled plasma (TCP) chamber has one or more elements of a different type than one or more elements of an inductively coupled plasma (ICP) chamber and both the TCP and the ICP chambers have one or more elements of different types than one or more elements of an electron cyclotron resonance (ECR) plasma chamber.

Examples of elements of a plasma chamber include an upper electrode, a lower electrode, an upper plasma exclusion zone (PEZ) ring, a lower PEZ ring, a confinement ring assembly, an edge ring, an insulator layer, gas distribution apertures, walls of the plasma chamber, an upper dielectric ring surrounding the upper electrode, an upper electrode extension surrounding the upper dielectric ring, a lower dielectric ring surrounding the lower electrode, a lower electrode extension surrounding the lower dielectric ring, etc. In various embodiments, the lower electrode and the lower electrode extension are made of a metal, e.g., anodized aluminum, alloy of aluminum, etc. Also, in some embodiments, the upper electrode and the upper electrode extension are made of a metal, e.g., aluminum, alloy of aluminum, etc. In several embodiments, the upper electrode is located opposite to and facing the lower electrode and the upper electrode extension is located opposite to and facing the upper electrode.

Examples of dimensions of an element include a size of the element, a length of the element, a depth of the element, a width of the elements, a surface area of the element, a volume occupied by the element, etc.

Examples of elements of different types include a plate electrode, an electric coil electrode, etc.

In various embodiments, the plasma chamber 2 is structurally identical to plasma chamber 1 and has a different identification code than that of the plasma chamber 1. For example, an entity identifies the plasma chamber 1 using an identity code aaaa and the entity identifies the plasma chamber 2 using an identity code bbbb.

In a number of embodiments, the plasma chamber 1 is structurally identical to the plasma chamber 2 and is used to perform the same function as that of the plasma chamber 1. Examples of a function performed by a plasma chamber include physical vapor deposition (PVD), chemical vapor deposition (CVD), plasma-enhanced CVD (PECVD), metal CVD, a high-density plasma CVD (HDP-CVD) function, a photoresist strip function, a photoresist surface preparation, ultraviolet thermal processing (UVTP), etc.

In various embodiments, the plasma chamber 2 is structurally and functionally identical to plasma chamber 1 and has a different identification code than that of the plasma chamber 1.

The power delivered to the plasma chamber 1 is adjusted to achieve the relationship generated using the plasma chamber 2. In some embodiments, instead of adjusting the power delivered to the plasma chamber 1 to achieve the relationship associated with the plasma chamber 2, the power delivered to the plasma chamber 2 is adjusted to achieve the relationship generated using the plasma chamber 1.

In several embodiments, when the plasma chamber 1 is a golden chamber, which has a higher yield than that of the plasma chamber 2, the power delivered to the plasma chamber 2 is adjusted to achieve the relationship generated using the plasma chamber 1. Also, when the plasma chamber 2 is a golden chamber, which has a higher yield than that of the plasma chamber 1, the power delivered to the plasma chamber 1 is adjusted to achieve the relationship generated using the plasma chamber 2.

In various embodiments, a plasma chamber has a higher yield than another plasma chamber when the higher yielding plasma chamber is used to etch a wafer to achieve a higher aspect ratio than that achieved using the lower yielding plasma chamber, when use of the higher yielding plasma chamber results in wafers that are cleaner than those cleaned using the lower yielding plasma chamber, when the higher yielding plasma chamber etches at a faster rate than that achieved using the lower yielding plasma chamber, when the higher yielding plasma chamber cleans wafers at a faster rate than that achieved using the lower yielding plasma chamber, when the higher yielding plasma chamber has a higher rate of processing wafers than that of the lower yielding plasma chamber, or a combination thereof.

In the graph 102, the function of the variable is plotted along a y-axis and power is plotted along an x-axis. In some embodiments, the power plotted along the x-axis is delivered power, which is power delivered to a plasma chamber. As an example, delivered power is a difference between supplied power and reflected power. Supplied power is power supplied to a plasma chamber by a radio frequency (RF) generator and reflected power is power reflected from the plasma chamber towards the RF generator. In various embodiments, the power plotted along the x-axis is supplied power instead of delivered power.

A solid line 101 of the graph 102 is plotted using the plasma chamber 1. For example, the power delivered to the plasma chamber 1 is plotted along the x-axis. Moreover, a current is measured at a point on an element located between an RF generator and a wafer within the plasma chamber 1 and a square of the current is plotted along the y-axis. As another example, instead of the current, a voltage is measured at the point and a square of the voltage is plotted on the y-axis. The square of the voltage is plotted against power delivered to the plasma chamber 1 to generate the solid line 101.

In several embodiments, a no-plasma test is performed using the plasma chamber 1 to obtain the relationship illustrated in the solid line 101. For example, an amount of pressure is maintained below a threshold or above a threshold within the plasma chamber 1 to avoid striking plasma within the plasma chamber 1. As another example, during the no-plasma test, an RF generator generates an RF signal that is provided via an impedance matching circuit and an RF transmission line to a lower electrode of a plasma chamber. In this example, a minimal amount of plasma is stricken within the plasma chamber.

Electrical elements that are located between an RF generator and the wafer include elements that couple the RF generator to a plasma chamber. Examples of elements between an RF generator and a wafer include an RF cable, an impedance matching circuit, an RF transmission line, and an electrostatic chuck (ESC). An RF cable couples an RF generator to an impedance matching circuit, which is coupled via an RF transmission line to an ESC of a plasma chamber.

A dashed line 103 of the graph 102 is plotted using the plasma chamber 2 in a similar manner in which the solid line 101 of the graph 102 is plotted for the plasma chamber 1. For example, the power delivered to the plasma chamber 2 is plotted along the x-axis. Moreover, a current is measured at a point on an element located between an RF generator and a wafer within the plasma chamber 2 and a square of the current is plotted along the y-axis. As another example, instead of the current, a voltage is measured at the point and a square of the voltage is plotted on the y-axis. The square of the voltage is plotted against power delivered to the plasma chamber 2 to generate the dashed line 103.

In several embodiments, a no-plasma test is performed using the plasma chamber 2 to obtain the relationship illustrated in the dashed line 103. For example, an amount of pressure is maintained below a threshold or above a threshold within the plasma chamber 2 to avoid striking plasma within the plasma chamber 2.

A line is horizontally extended from a variable function 1 (VF1), e.g. square of a current value, square of a voltage value, etc., past a point 109 on the solid line 101 to intersect a point 111 on the dashed line 103. A line is vertically extended from the point 111 to a point P2 on the x-axis. The point P2 has a power value of P2.

Instead of providing, e.g., delivering, supplying, etc., a power P1 to the plasma chamber 1 to achieve the variable function 1, the power P2 is provided to the plasma chamber 1 to achieve the variable function 1. For example, to achieve the higher yield of the plasma chamber 2, instead of providing the power P1 to the plasma chamber 1 to achieve the variable function 1, the power P2 is provided to the plasma chamber 1 to achieve the variable function 1. As another example, at a time the power P1 is to be provided to the plasma chamber 1 to achieve the variable function 1, the power P2 is provided to the plasma chamber 1 to achieve the variable function 1 and to achieve the higher yield of the plasma chamber 2. Similarly, in some embodiments, instead of providing the power P2 to the plasma chamber 2 to achieve the variable function 1, the power P1 is provided to the plasma chamber 2 to achieve the variable function 1.

In some embodiments, provided power is delivered power or supplied power.

In various embodiments, instead of extending lines horizontally and/or vertically within the graph 102 to determine the power P2 corresponding to the variable function 1, a slope 1 of the solid line 101 and a slope 2 of the dashed line 103 is calculated. The power P1 that is to be provided to the plasma chamber 1 to achieve the variable function 1 is multiplied with a ratio of slope 1 and slope 2 to provide the power P2 to the plasma chamber 1. For example, when the higher yielding relationship, shown by the dashed line 103, of the plasma chamber 2 is to be achieved, instead of providing the power P1 to the plasma chamber 1 to achieve the variable function 1, a power value, e.g., the power value P2, generated by multiplying the power value P1 with the ratio of slope 1 and slope 2 is provided to the plasma chamber 1 to achieve the variable function 1.

In some embodiments, when the relationship associated with the plasma chamber 1 is to be achieved, e.g., to achieve the higher yield of the plasma chamber 1 and to achieve the variable function 1, the power value P2 is multiplied by a ratio of slope 2 and slope 1 to generate the power value P1 that is to be provided to the plasma chamber 2.

In some embodiments, the terms "power value P1" and "power P1" are used interchangeably. In various embodiments, the terms "power value P2" and "power P2" are used interchangeably.

It should be noted that each of slope 1 and slope 2 provides impedance at a point, in a plasma system, at which the variable is measured when the variable is voltage. It should further be noted that each of slope 1 and slope 2 provides an inverse of impedance at a point, in a plasma system, at which the variable is measured when the variable is current.

Figure 2:
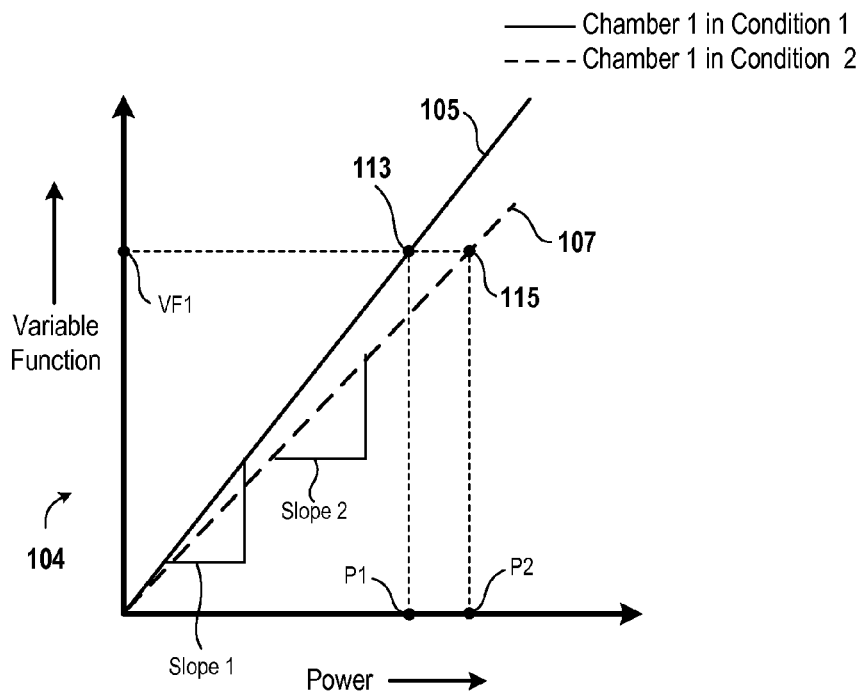
FIG. 2 is a diagram of an embodiment of a graph to illustrate intra-chamber matching using a power control mode, in accordance with an embodiment described in the present disclosure.

FIG. 2 is a diagram of an embodiment of a graph 104 to illustrate intra-chamber matching using a power control mode. In intra-chamber matching, the function of the variable is plotted along a y-axis and power provided to the plasma chamber 1 is plotted along an x-axis for the same plasma chamber 1 for two different conditions of the plasma chamber 1. The two different conditions include a condition 1 and a condition 2.

A solid line 105 is plotted when the plasma chamber 1 is in the condition 1. The solid line 105 illustrates a relationship between the function of the variable and the power delivered to the plasma chamber 1 during the condition 1. Moreover, a dashed line 107 is plotted when the plasma chamber 1 is in the condition 2. The dashed line 107 is a relationship between the function of the variable and the power delivered to the plasma chamber 1 during the condition 2.

In some embodiments, the condition 2 is a condition that occurs at a different time than a time of occurrence of the condition 1. For example, the condition 2 occurs after corrosion of one or more elements of the plasma chamber 1 and the condition 1 occurs before the corrosion.

In several embodiments, the condition 2 is a condition that occurs after use of the plasma chamber 1 and the condition 1 is a condition that occurs before the use. The plasma chamber 1 is in the condition 1 before the use. For example, after the plasma chamber 1 is used to perform wet cleaning of a wafer, the plasma chamber 1 has a different condition, which is the condition 2, than before the performance of the wet cleaning. As another example, after the plasma chamber 1 is used to etch a wafer, the plasma chamber 1 has a different condition, which is the condition 2, than before the performance of the etching. As yet another example, after one or more gases, e.g., process gas, inert gas, a combination thereof, etc., are supplied within the plasma chamber 1, the plasma chamber 1 has a different condition than before the supplying of the gases.

When the plasma chamber 1 is in the condition 1, power is provided to the plasma chamber 1, the power is plotted along the x-axis, the variable is measured at a point between the RF generator coupled to the plasma chamber 1 and a wafer in the plasma chamber 1, and the function of the variable is plotted along the y-axis. The relationship illustrated using the solid line 105 is generated when the plasma chamber 1 is in the condition 1.

Similarly, when the plasma chamber 1 is in the condition 2, the relationship illustrated using the dashed line 107 is generated by providing power to the plasma chamber 1, plotting the power along the x-axis, measuring the variable at a point between the RF generator coupled to the plasma chamber 1 and a wafer within the plasma chamber, calculating a function of the variable, and plotting the function versus the power.

Moreover, in a manner similar to that described above in case of the plasma chambers 1 and 2, the power value P2 is generated based on the variable function 1. For example, a line is horizontally extended from a point 113, corresponding to the variable function 1, on the solid line 105 to intersect a point 115 on the dashed line 107. The variable function 1 is achieved at both the points 113 and 115. A line is vertically extended from the point 115 to a point P2, e.g., the power value P2, on the x-axis.

The power value P2 is provided to the plasma chamber 1 when the plasma chamber 1 is in the condition 1 instead of providing the power value P1 to achieve the variable function 1.

It should be noted that in some embodiments, the condition 1 of the plasma chamber 1 results in a higher yield than that resulting during the condition 2 of the plasma chamber 1. In various embodiments, the condition 2 of the plasma chamber 1 results in a higher yield than that resulting during the condition 1 of the plasma chamber 1.

In various embodiments, instead of generating the power value P2 by extending a line horizontally from the point 113 and further by vertically extending a line from the point 115 towards the x-axis, the power value P1 is generated by extending a line horizontally from the point 115 to the solid line 105 to intersect the solid line 105 at the point 113 and vertically extending from the point 113 on the solid line 105 to the power value P1. The power value P1 is provided to the plasma chamber 1 during the condition 2 instead of providing the power value P2 to achieve the variable function 1.

In several embodiments, regardless of whether the plasma chamber 1 is in the condition 1 or the condition 2, a no-plasma test is performed using the plasma chamber 1 to obtain the relationships illustrated in the lines 105 and 107. For example, pressure within the plasma chamber 1 is maintained at an amount below a threshold or above a threshold to avoid striking plasma within the plasma chamber 1.

Furthermore, in some embodiments, instead of using the horizontal and/or vertical extensions, the slope 1 of the solid line 105 and the slope 2 of the dashed line 107 are calculated. The power value P2 is determined by multiplying the power value P1 with a ratio of slope 1 to slope 2. The power value P2 is provided to the plasma chamber 1 during the condition 1 instead of providing the power value P1 during the condition 1.

In various embodiments, instead of determining the power value P2 from the ratio of slopes 1 and 2, the power value P1 is determined by multiplying the ratio of slope 2 to slope 1 to the power value P2, and the power value P1 is provided to the plasma chamber 1 during the condition 2. The power value P1 is provided to the plasma chamber 1 instead of providing the power value P2 during the condition 2.

Figure 3:
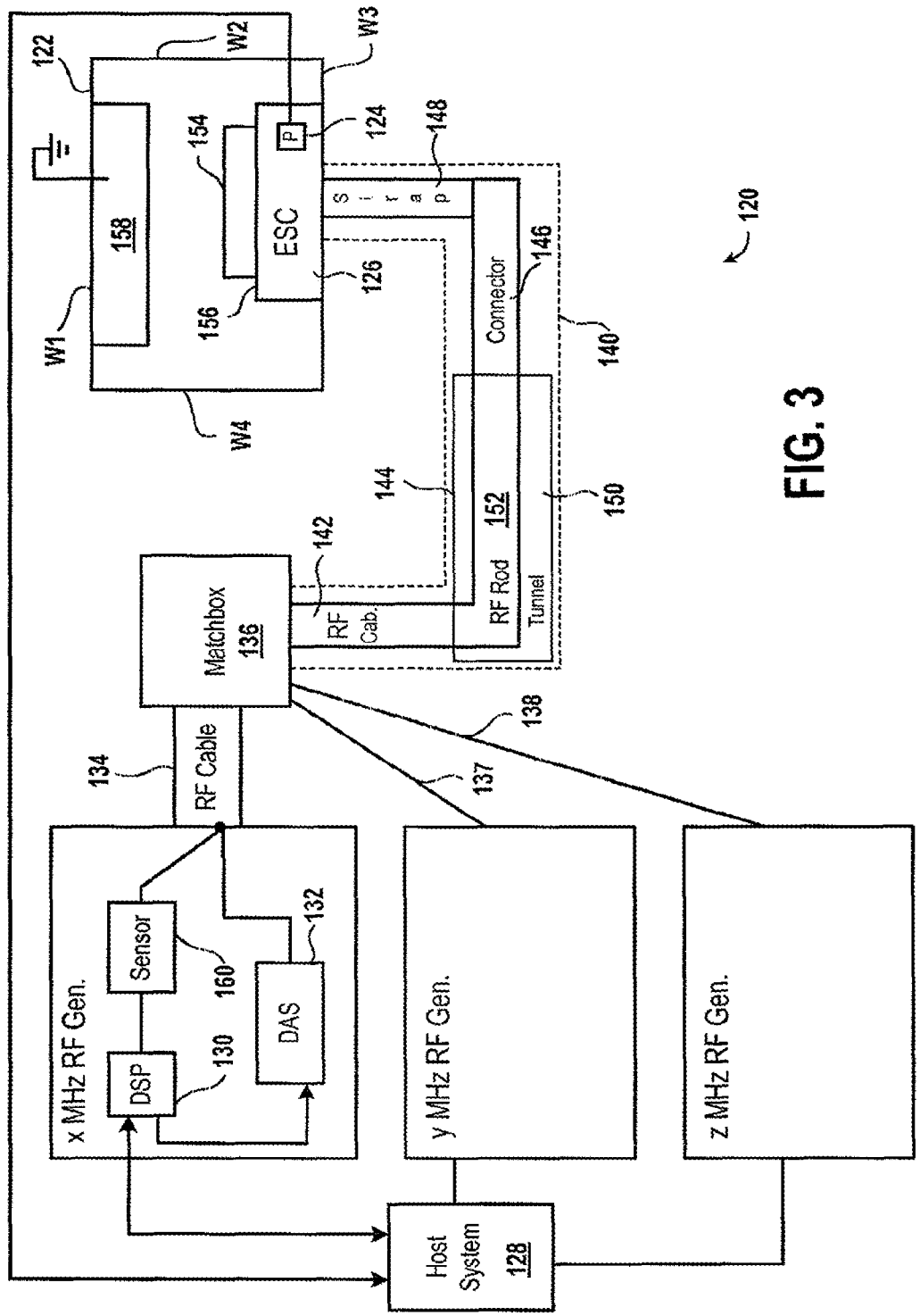
FIG. 3 is a block diagram of a plasma system for generating one or more relationships between a function of variable and power delivered to a plasma chamber by using a probe within an electrostatic chuck (ESC), in accordance with an embodiment described in the present disclosure.

FIG. 3 is a block diagram of an embodiment of a system 120 for generating one or more relationships between the function of the variable and power delivered to a plasma chamber 122 by using a probe 124 within an ESC 126. The plasma chamber 122 is an example of the chamber 1.

In some embodiments, one of the relationships, e.g., the relationship illustrated using the solid line 101 (FIG. 1), the relationship illustrated using the solid line 105 (FIG. 2), etc., is generated during the condition 1 of the plasma chamber 122 and another one of the relationships, e.g., the relationship illustrated using the dashed line 107 (FIG. 2), etc., is generated during the condition 2 of the plasma chamber 122.

A host system 128 is coupled to one or more RF generators, e.g., an x megahertz (MHz) RF generator, a y MHz RF generator, a z MHz RF generator, etc. The x MHz generator may be a 2 MHz RF generator, the y MHz RF generator may be a 27 MHz RF generator, and the z MHz RF generator may be a 60 MHz RF generator.

Examples of the host system 128 include a computer, a processor-based system, a workstation, a laptop, a desktop, a tablet, a cell phone, etc.

As used herein, a processor may be an application specific integrated circuit (ASIC), a programmable logic device (PLD), a microprocessor, a central processing unit (CPU), etc.

In some embodiments, instead of the 2 MHz RF generator, an RF generator of a different frequency, e.g., a 3 MHz RF generator, a 4 MHz RF generator, a 5 MHz RF generator, etc., may be used. Similarly, RF generators of different frequencies may be used instead of the y and z MHz RF generators.

In several embodiments, the x MHz RF generator may be a 27 MHz RF generator. In these embodiments, the y and z MHz RF generators are 2 and 60 MHz RF generators.

In a number of embodiments, the x MHz RF generator may be a 60 MHz RF generator. In these embodiments, the y and z MHz RF generators are 2 and 27 MHz RF generators.

When the plasma chamber 122 is in the condition 1, the host system 128 sends power values and a frequency of operation to a digital signal processor (DSP) 130 of the x MHz RF generator. The DSP 130 sends the power values and the frequency to a driver and amplifier system (DAS) 132 of the x MHz RF generator.

The DAS 132 receives the power values and the frequency and generates an RF signal having the power values and the frequency. The RF signal is supplied via an RF cable 134 to a matchbox 136, which is an impedance matching circuit.

In some embodiments, the DAS 132 amplifies an RF signal that is generated by a driver of the DAS to generate an amplified RF signal, which is supplied via the RF cable 134 to the matchbox 136.

In various embodiments, when an RF signal is generated by the x MHz RF generator to generate the solid line 101 (FIG. 1), the solid line 105 (FIG. 2), the dashed line 103 (FIG. 1), and/or the dashed line 107 (FIG. 2), the y and z MHz RF generators do not generate RF signals. For example, the y and z MHz RF generators are turned off when the x MHz RF generator is used to generate an RF signal.

An impedance matching circuit includes electric circuit components, e.g., inductors, capacitors, etc. to match an impedance of a power source coupled to the impedance matching circuit with an impedance of a load coupled to the impedance matching circuit. For example, the matchbox 136 matches an impedance of a source, which includes one or more of the x, y, and z MHz RF generators that are operational, and an impedance of one or more of the RF cables 134, 137, and 138 with an impedance of an RF transmission line 140 and the plasma chamber 122. The RF cables 134, 137, and 138 couple the matchbox 136 to the x, y, and z MHz RF generators. An impedance match between a power source and a load reduces chances of power being reflected from the load towards the power source.

The RF transmission line 140 is coupled to the matchbox 136 and to the plasma chamber 122. The RF transmission line 140 includes an RF cable 142, which is coupled to an RF tunnel 144, and the RF tunnel 144 is coupled to an RF strap 148. Within the RF tunnel 144 lays an insulator 150 and an RF rod 152. The insulator 150 insulates the RF rod 152 from a sheath of the RF tunnel 144. The RF rod 152 is coupled via a connector 146 to the RF strap 148, which is sometimes also known as an RF spoon. The RF strap 148 is coupled to the lower electrode of the ESC 126.

A wafer 154, e.g., a semiconductor wafer, is supported on an upper surface 156 of the ESC 126. Integrated circuits, e.g., application specific integrated circuits (ASICs), programmable logic devices (PLDs), etc. are developed on the wafer 154 and the integrated circuits are used in a variety of devices, e.g., cell phones, tablets, smart phones, computers, laptops, networking equipment, etc. An upper electrode 158 faces the lower electrode of the ESC 126.

The plasma chamber 122 has walls W1, W2, W3, and W4 that enclose plasma that is generated within the plasma chamber 122. It should be noted that in some embodiments, the plasma chamber 122 includes more than four walls. In several embodiments, a wall of the plasma chamber 122 may be perpendicular to an adjacent wall. In various embodiments, a wall of the plasma chamber 122 may form a non-perpendicular angle with an adjacent wall of the plasma chamber 122.

The probe 124 is embedded within the ESC 126. In several embodiments, instead of being embedded within the ESC 126, the probe 124 is coupled to the ESC 126. The probe 124 may be located within the plasma chamber 122.

Examples of the probe 124 include a current probe that measures current, a voltage probe that measures voltage, and a voltage and current probe that measures voltage and current. The probe 124 is coupled to the host system 128. For example, the probe 124 is coupled to an analog-to-digital converter of the host system 128 and the analog-to-digital converter is coupled to a processor of the host system 128.

In some embodiments, instead of the probe 124, two probes are used. For example, a voltage probe that measures voltage and a current probe that measure current is used instead of the probe 124.

An RF signal that is generated by the x MHz RF generator is communicated via the RF cable 134, the matchbox 136, the RF cable 142, the RF rod 152, the connector 146, and the RF strap 148 to the lower electrode of the ESC 126.

In some embodiments, the upper electrode 158 includes gas distribution apertures that are coupled to a central gas feed (not shown). The central gas feed receives one or more gases, e.g., process gases, inert gases, a combination thereof, etc., from a gas supply (not shown). Examples of process gases include an oxygen-containing gas, such as $O_2$. Other examples of a process gas include a fluorine-containing gas, e.g., tetrafluoromethane ($CF_4$), sulfur hexafluoride ($SF_6$), hexafluoroethane ($C_2F_6$), etc. The upper electrode 158 is grounded.

When the RF signal generated by the x MHz RF generator is provided to the plasma chamber 122, a no-plasma test is performed. For example, an amount of pressure is maintained within the plasma chamber 122 that is in the condition 1 to avoid striking plasma within the plasma chamber 122. As another example, a gas is not supplied or a limited amount of the gas is supplied to maintain pressure within the plasma chamber 122 below a threshold. During a no-plasma test, a minimal amount of plasma is generated in the plasma chamber 122.

During the no-plasma test, the probe 124 measures a variable and sends the measurement to the host system 128. The host system 128 receives the measurement of the variable and the analog-to-digital converter of the host system 128 converts the measurement from an analog form to a digital form. In some embodiments, the probe 124 converts the measurement from an analog to a digital form before sending the measurement to the host system 128.

The processor of the host system 128 generates the function of the variable based on the measurement of the variable. For example, the processor of the host system 128 calculates a square of the variable. It should be noted that a sensor 160, e.g., a voltage and current sensor, a power sensor, etc., which is coupled to the RF cable 134, measures supplied power, which is power supplied by the x MHz RF generator, or measures, delivered power, which is a difference between the supplied power and power that is reflected via the RF cable 134 from the plasma chamber 122 towards the x MHz RF generator. The measurement of the provided power is sent by the sensor 160 via the DSP 130 to the processor of the host system 128. Continuing with the example, the processor determines a relationship, e.g., the relationship illustrated in the solid line 101 (FIG. 1), the relationship illustrated in the solid line 105 (FIG. 2), etc., between the function of the variable and the provided power over a period of time.

In some embodiments, instead of the sensor 160 measuring both the supplied and reflected powers, the sensor 160 measures reflected power and the supplied power is a power value sent by the host system 128 to the DSP 130.

Also, when a condition of the plasma chamber 122 changes after the relationship is determined, a no-plasma test is performed. For example, an amount of pressure is maintained within the plasma chamber 122 that is in the condition 2 to avoid striking plasma within the plasma chamber 122. The probe 124 measures the variable of the plasma and the sensor 160 measures the supplied and reflected powers.

After the condition changes, the processor of the host system 128 receives the measurement of the variable from the probe 124 and receives the measurements of the supplied and reflected powers via the DSP 130, calculates the function of the variable from the measurement of the variable, determines delivered power from the supplied and reflected powers, and determines a relationship, e.g., the relationship illustrated in the dashed line 107 (FIG. 2), etc., between the function of the variable and the delivered power over a period of time.

In some embodiments, instead of using the delivered power to determine the relationship during the condition 2, the supplied power is used. For example, a relationship between the supplied power and the function of the variable is determined.

During or before subsequent processing of the wafer 154, the processor of the host system 128 performs intra-chamber matching for the plasma chamber 122 in a manner described above with reference to FIG. 2. For example, the processor calculates the slope 1 and the slope 2 (FIG. 2), calculates a ratio of the slope 2 and the slope 1, multiplies the power value P1 with the ratio to compute the power value P2. As another example, instead of determining the ratio of the slope 2 to slope 1 (FIG. 2), the processor calculates a ratio of the slope 1 to the slope 2 (FIG. 2) and multiplies the power value P2 with the ratio to compute the power value P1. As yet another example, to achieve the variable function 1 during the condition 1, the processor extends a line horizontally from the point 113 to intersect the dashed line 107 at the point 115 (FIG. 2). Continuing with the example, the processor extends a vertical line from the intersected point 115 to intersect the x-axis (FIG. 2) at the power value P2 to determine the power value P2 for the condition 1. As another example, to achieve the variable function 1 during the condition 2, the processor extends a line horizontally from the point 115 to intersect the solid line 105 at the point 113 (FIG. 2). The processor extends a line vertically from the intersected point 113 on the solid line 105 to intersect a point, which is the power value P1, on the x-axis to determine the power value P1 for the condition 2. The subsequent processing of the wafer 154 occurs after obtaining the graph 102 and/or the graph 104 (FIGS. 1 and 2).

Examples of processing the wafer 154 includes cleaning the wafer, depositing materials on the wafer 154, etching the wafer 154, sputtering the wafer 154, applying plasma to the wafer 154, etc.

In some embodiments, during the subsequent processing of the wafer 154, a power value, e.g., the power value P1, the power value P2, etc., to be provided to the plasma chamber 122 that is in a condition, e.g., the condition 1, the condition 2, etc., is identified, e.g., read, etc., from a storage device of the host system 128. The storage device is further described below. When an RF signal having the power value is supplied and the process gas is supplied to the plasma chamber 122 during the subsequent processing, plasma is stricken within the plasma chamber 122. The plasma is used to process the wafer 154.

In various embodiments, a processing condition is achieved during the subsequent processing of the wafer 154. For example, during the subsequent processing using the plasma chamber 122 in the condition 2, the power value P1 and the variable function 1 are achieved. As another example, during the subsequent processing using the plasma chamber 122 in the condition 1, the power value P2 and the variable function 1 are achieved.

In some embodiments in which the power values plotted along the x-axis are delivered power values, during subsequent processing of the wafer 154, when the plasma chamber 122 is in the condition 1 and the power value P2 associated with the condition 2 is to be delivered to the plasma chamber 122, the processor of the host system 128 determines a supply power value to achieve the delivered power value P2 and instead of sending a supply power value to achieve the delivered power value P1, sends the supply power value to achieve delivered power P2 during the condition 1 of the plasma chamber 122. For example, the processor supplies a power value to the DSP 130, which sends the power value to the DAS 132. The DAS 132 generates an RF signal based on the power value and supplies the RF signal to the plasma chamber 122. When the RF signal is supplied to the plasma chamber 122, the sensor 160 measures reflected power and sends the measurement to the processor of the host system 128. The processor of the host system 128 calculates the delivered power from the measurement of the reflected power and the supplied power of the RF signal and determines whether the delivered power is equal to the power value P2. Upon determining that the delivered power value is equal to P2, the processor of the host system 128 continues to send a supply power value to achieve the delivered power value P2 to the DSP 130 to continue to supply the RF signal corresponding to the delivered power P2. On the other hand, the operations of changing the supplied power value, measuring the supplied and reflected power, and calculating the delivered power are repeated until the delivered power matches the power value P2.

Similarly, in various embodiments in which the power values plotted along the x-axis are delivered power values, during subsequent processing of the wafer 154, when the plasma chamber 122 is in the condition 2 and the power value P1 associated with the condition 1 is to be delivered to the plasma chamber 122, the processor of the host system 128 determines a supply power value to achieve the delivered power value P1 and instead of sending a supply power value to achieve the delivered power value P2, sends the supply power value to achieve the delivered power value P1 during the condition 2 of the plasma chamber 122.

In embodiments in which the power values plotted along the x-axis are supply power values, during subsequent processing of the wafer 154, when the plasma chamber 122 is in the condition 1 and the power value P2 associated with the condition 2 is to be supplied to the plasma chamber 122, the processor of the host system 128 sends the power value P2 during the condition 1 of the plasma chamber 122 instead of sending the power value P1 during the condition 1 to achieve the variable function 1 and the x MHz RF generator supplies an RF signal having the power value P2 instead of supplying an RF signal having the power value P1.

Similarly, in a number of embodiments in which power values plotted along the x-axis are supply power values, during subsequent processing of the wafer 154, when the plasma chamber 122 is in the condition 2 and the power value P1 associated with the condition 1 is to be supplied to the plasma chamber 122, the processor of the host system 128 sends the power value P1 during the condition 2 of the plasma chamber 122 instead of sending the power value P2 during the condition 2 to achieve the variable function 1 and the x MHz RF generator supplies an RF signal having the power value P1 instead of supplying an RF signal having the power value P2.

In several embodiments, instead of using the probe 124 in conjunction with the host system 128, a network analyzer or an impedance scanner is used instead of the probe 124. For example, the network analyzer includes an RF probe that is coupled to a network analyzer, which is further coupled to the host system 128. The RF probe may be a small microwave antenna. The network analyzer supplies electrical signals to the RF probe. Upon receiving the electrical signals, the RF probe launches microwave signals into the plasma chamber 122. The microwave signals interact with the plasma within the plasma chamber 122 and are detected by the RF probe. The RF probe converts the detected microwave signals into electrical signals. The network analyzer determines a reflection coefficient from the electrical signals and sends the reflection coefficient to the host system 128. The processor of the host system 128 keeps track of a change in the reflection coefficient over time and generates a graph, e.g., the graph 102 (FIG. 1), the graph 104 (FIG. 2), etc., to determine relationships between the reflection coefficient and power provided to the lower electrode of the ESC 126. The relationships are then used by the processor of the host system 128 to determine power to provide to the lower electrode to achieve a condition, e.g., the condition 1, the condition 2, etc., or to perform chamber-to-chamber matching.

In several embodiments, when the network analyzer or the impedance scanner is used, a no-plasma test is performed within the plasma chamber 122.

Figure 4A:
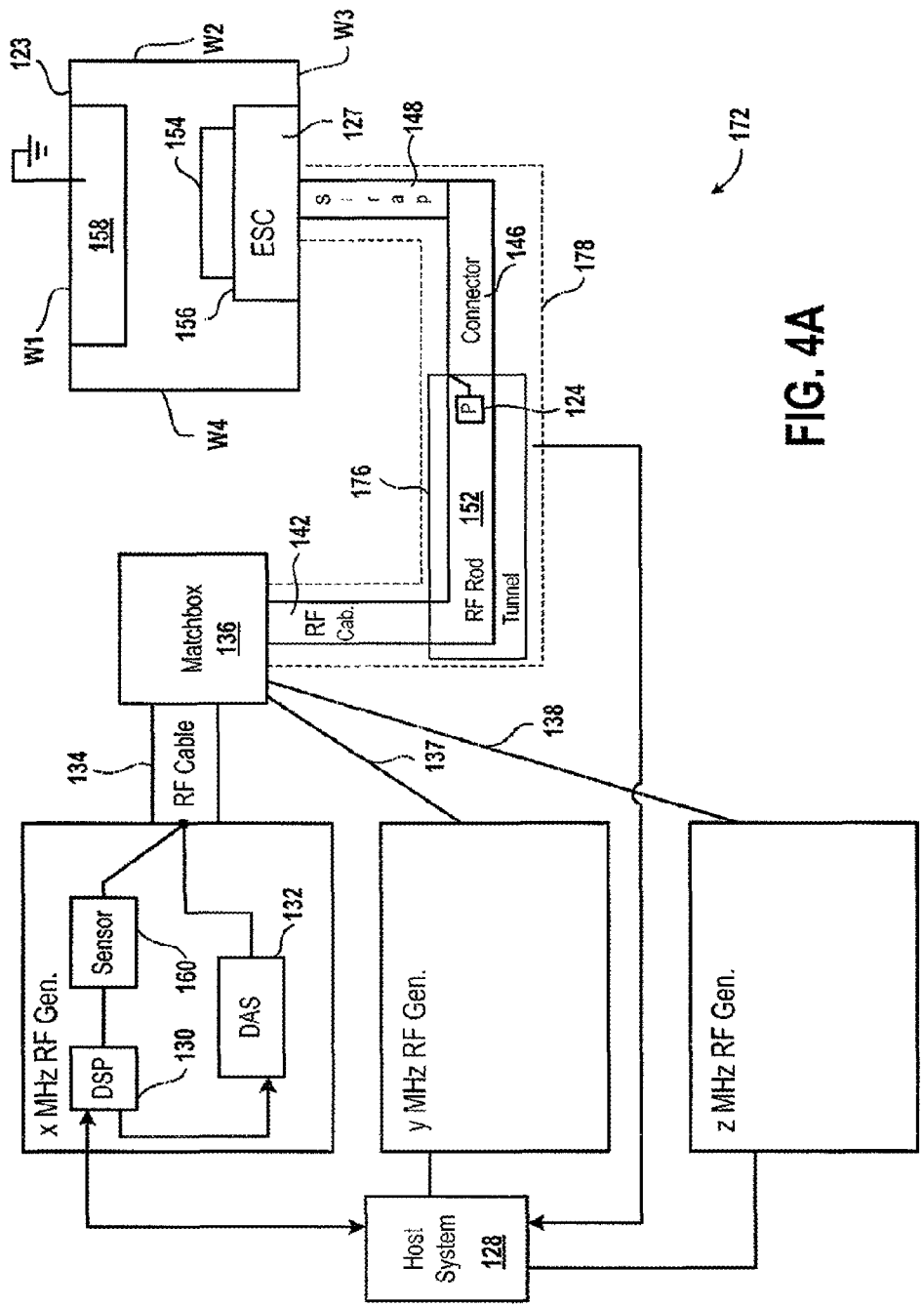
FIG. 4A is a block diagram of a plasma system for generating one or more relationships between the function of the variable and power delivered to a plasma chamber by using the probe within a radio frequency tunnel, in accordance with an embodiment described in the present disclosure.

FIG. 4A is a block diagram of an embodiment of a plasma system 172 for generating one or more relationships between the function of the variable and power delivered to a plasma chamber 123 by using the probe 124 within an RF tunnel 176. The plasma system 172 operates in a similar manner as that of the plasma system 120 (FIG. 3) except that the plasma chamber 123 excludes the probe 124 within the ESC 126. Instead, the plasma system 172 includes the probe 124 within an insulator of the RF tunnel 176. The probe 124 is coupled to an output of the RF rod 152.

The output of the RF rod 152 is coupled to an input of the RF strap 148 via the connector 146. An input of the RF rod 152 is coupled to an output of the RF cable 142. An input of the RF cable 142 is coupled to the matchbox 136. An output of the RF strap 148 is coupled to a lower electrode of an ESC 127 of a plasma chamber 123. The ESC 127 is similar in structure and function to the ESC 126 (FIG. 3) except that the ESC 127 excludes the probe 124 (FIG. 3).

In some embodiments, the probe 124 is coupled to the RF rod 152 and is located outside the RF tunnel 176.

The RF cable 142, the RF rod 152, the RF tunnel 176, the connector 146, and the RF strap 148 are parts of an RF transmission line 178 that couple the matchbox 136 to the lower electrode of the ESC 127.

The probe 124 measures the variable when the x MHz RF generator supplies power to the plasma chamber 123. The power is supplied to the plasma chamber 123 via the RF cable 134, the matchbox 136, and the RF transmission line 178.

In some embodiments, the variable is measured from the plasma chamber 123 when the process gas is supplied to the plasma chamber 123 and an RF signal is provided to the plasma chamber 123 to strike plasma within the plasma chamber 123.

In several embodiments, the variable is measured during a no-plasma test. For example, the variable is measured from the plasma chamber 123 when an RF signal is provided to the plasma chamber 123, a gas is supplied to the plasma chamber, and an amount of pressure is maintained below a threshold or above a threshold to avoid striking plasma within the plasma chamber 123 or to strike a minimal amount of plasma within the plasma chamber 123.

The measurement of the variable is sent by the probe 124 to the host system 128. Upon receiving the measurement of the variable, the analog-to-digital converter of the host system 128 converts the measurement from an analog form to a digital form and sends the digital measurement to the processor of the host system 128. The processor of the host system 128 applies a computer-generated model of one or more portions of the RF transmission line 178 and/or of the ESC 127 to the measurement in the digital form to determine the variable at the ESC 127. The computer-generated model is described below.

In some embodiments, instead of performing the conversion from the analog to the digital format within the host system 128, the probe 124 converts the analog measurement of the variable to the digital format and sends the digital measurement to the processor of the host system 128.

Figure 4B:
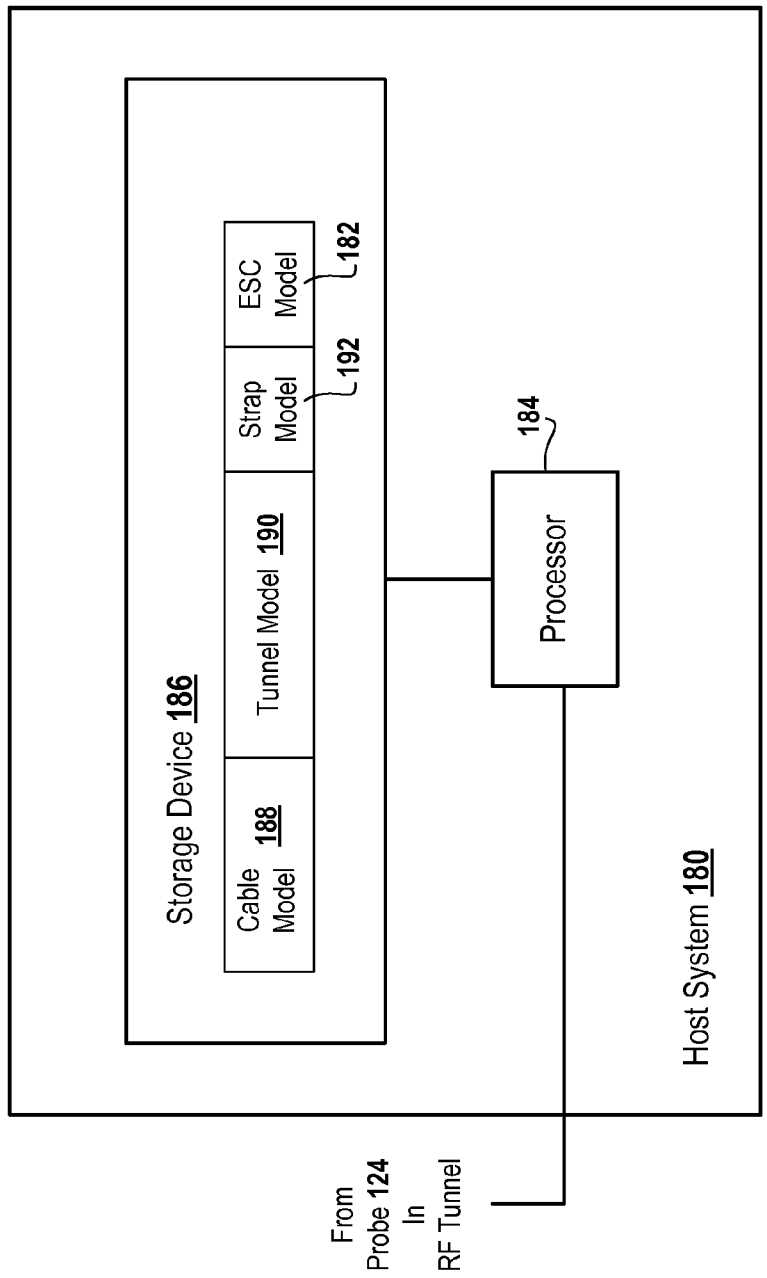
FIG. 4B is a block diagram of a host system for using a computer-generated model to determine a value of a variable at an ESC model, in accordance with an embodiment described in the present disclosure.

FIG. 4B is a block diagram of an embodiment of a host system 180 for using a computer-generated model to determine a value of a variable at an ESC model 182. The host system 180 includes a processor 184 and a storage device 186, e.g., a random access memory (RAM), a read-only memory (ROM), or a combination thereof. In some embodiments, the storage device 186 is a hard disk, a flash memory, a disk array, etc. The host system 180 is an example of the host system 128 (FIG. 3). The storage device 186 is coupled to the processor 184 and stores a cable model 188, a tunnel model 190, a strap model 192, and the ESC model 182.

It should be noted that the cable model 188 is a computer-generated model of the RF cable 142 (FIG. 4A), the tunnel model 190 is a computer-generated model of the RF tunnel 176 (FIG. 4A), the strap model 192 is a computer-generated model of the RF strap 148 (FIG. 4A), and the ESC model 182 is a computer-generated model of the ESC 127 (FIG. 4A). For example, the tunnel model 190 has similar characteristics, e.g., capacitances, inductances, complex power, complex voltage and currents, etc., as that of the RF rod 152. As another example, the tunnel model 190 has the same capacitance, inductance, resistance, or a combination thereof as that of the RF rod 152. As yet another example, the strap model 192 has the same capacitance, inductance, resistance, or a combination thereof as that of the RF strap 148 (FIG. 4A). As another example, the ESC model 182 has the same capacitance, inductance, resistance, or a combination thereof as that of the ESC 127 (FIG. 4A).

The processor 184 receives the measurement of the variable from the probe 124 (FIG. 4A). The processor 184 determines a value of the variable at an output of the ESC model 182 based on the measurement of the variable received from the probe 124 and the characteristics of the strap model 192 and the ESC model 182. For example, the processor 184 receives a magnitude of the current at the output of the RF rod 152 (FIG. 4A), receives a magnitude of the voltage at the output of the RF rod 152, and receives a phase between the voltage and current, and determines a directed sum of the current, the voltage, and the phase and currents and voltages generated by the capacitances, inductances, and/or resistances of the strap model 192 and the ESC model 182 to determine voltage and current at the output of the ESC model 182. The currents and voltage generated by the capacitances, inductances, and/or resistances of the strap model 192 and the ESC model 182 include magnitudes of the voltages, magnitudes of the currents, and phases of the currents. In some embodiments, a resistance excludes a phase and is defined in terms of a current magnitude and a voltage magnitude.

The processor 184 uses the value of the variable at the output of the ESC model 182 instead of the measurement of the variable from the probe 124 to calculate the function of the variable to further determine relationships of the function of the variable with power that is provided to the plasma chamber 122 (FIG. 4A). Based on the relationships, the processor 184 calculates the power value P1 or the power value P2.

In various embodiments, the probe 124 is connected to an input of the RF rod 152 instead of to the output of the RF rod 152. In these embodiments, the processor 184 determines a value of the variable at an output of the ESC model 182 based on the measurement of the variable received from the probe 124 and the characteristics of the tunnel model 190, the strap model 192 and the ESC model 182.

In various embodiments, the probe 124 is coupled to any point between the x MHz RF generator and the wafer 154 (FIG. 4A). For example, the probe 124 is coupled to the RF cable 134 (FIG. 4A). In these embodiments, a computer-generated model of elements of the plasma system 172 (FIG. 4A) between the point and the wafer 154 is generated and variable at a computer-generated model of the ESC 127 is determined based on the variable measured with the probe 124 and impedances of elements between the point and the wafer 154. For example, when the probe 124 is coupled to a point on the RF cable 134, a computer-generated model of elements of the plasma system 172 between a portion of the RF cable 134 from the point to the matchbox 136, a computer model of the matchbox 136, a computer model of the RF cable 142, a computer model of the RF rod 152, a computer model of the RF strap 148, and a computer model of the ESC 127 are generated. In this example, a variable at the ESC model 182 is determined based on the variable measured at the point and impedances of a computer-generated model of the portion of the RF cable 134 (FIG. 4A), a computer-generated model of the matchbox 136, the cable model 188, the tunnel model 190, the strap model 192, and the ESC model 182. As another example, when the probe 124 is coupled to an output of the x MHz RF generator, a computer model of the RF cable 134, a computer model of the matchbox 136, a computer model of the RF transmission line 178, and a computer model of the ESC 127 are generated. The output of the x MHz RF generator is coupled to an input of the RF cable 134 (FIG. 4A). In this example, a variable at the output of the x MHz RF generator is measured and the variable at the wafer 154 is determined based on the measured variable and impedances of elements, e.g., resistors, capacitors, inductors, etc., of the RF cable 134, the matchbox 136, the RF transmission line 178, and the ESC 127.

In various embodiments, the ESC model 182 is not used to determine a variable at the ESC 127 (FIG. 4A). For example, when the probe 124 is coupled to a point on the RF cable 134, a computer model of elements of the plasma system 172 between a portion of the RF cable 134 from the point to the matchbox 136, a computer model of the matchbox 136, a computer model of the RF cable 142, a computer model of the RF rod 152, and a computer model of the RF strap 148 are generated. In this example, a variable at the ESC model 182 is determined based on the variable measured at the point and impedances of a computer-generated model of the portion of the RF cable 134, a computer-generated model of the matchbox 136, the cable model 188, the tunnel model 190, and the strap model 192.

Figure 5:
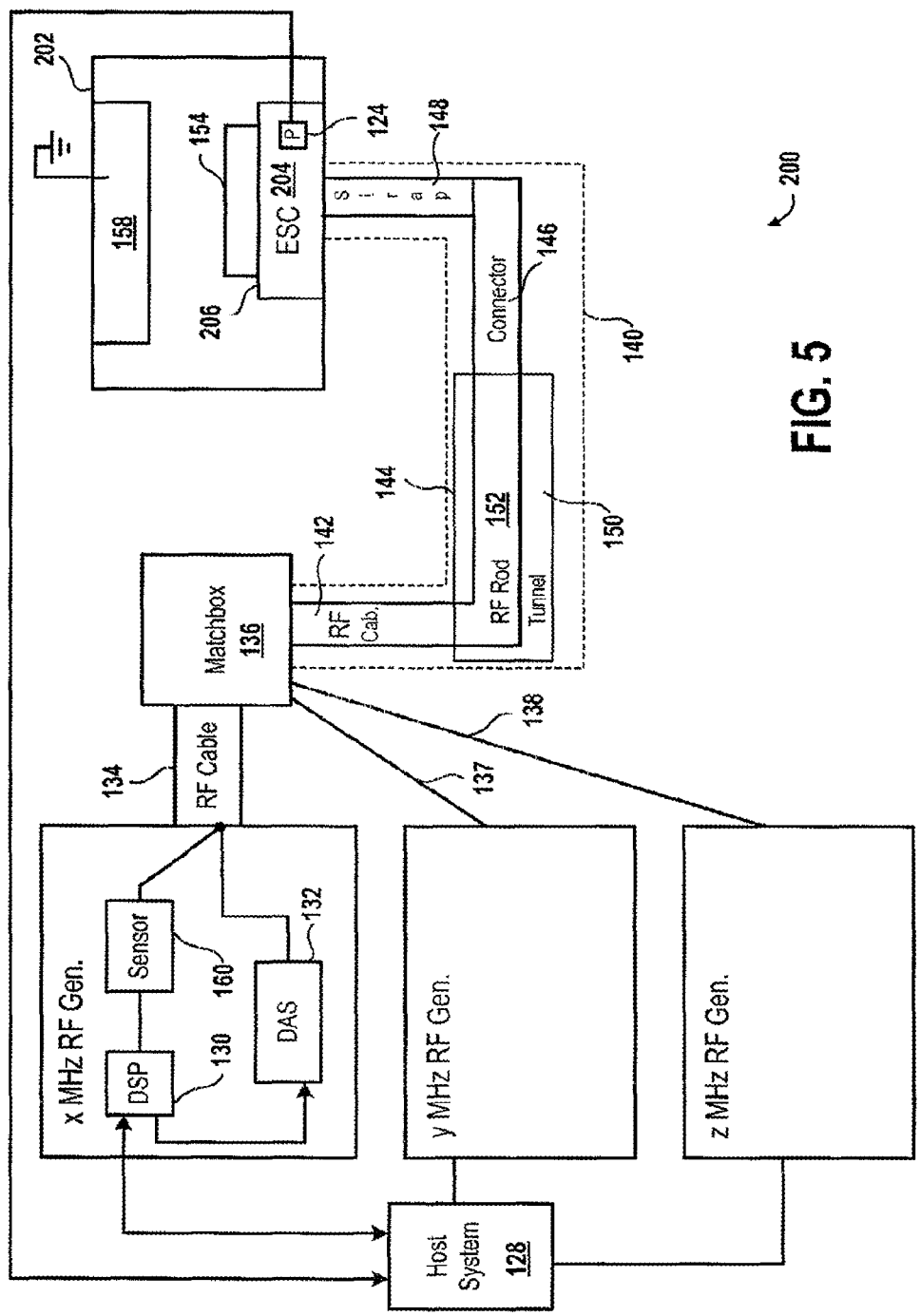
FIG. 5 is a block diagram of a plasma system for illustrating inter-chamber matching between a plasma chamber of the plasma system of FIG. 3 and another plasma chamber, in accordance with an embodiment described in the present disclosure.

FIG. 5 is a block diagram of an embodiment of a plasma system 200 for illustrating inter-chamber matching between the plasma chamber 122 (FIG. 3) and a plasma chamber 202, which is an example of the chamber 2. The system 200 is similar to the system 120 (FIG. 3) except that the system 200 includes a plasma chamber 202 instead of the plasma chamber 122. For example, the plasma chamber 202 has a different identification code than the plasma chamber 122 and both the plasma chambers 202 and 122 have the same structure and/or function. As another example, one or more elements of the plasma chamber 122 are replaced with one or more elements of the plasma chamber 202. As yet another example, the ESC 204 replaces the ESC 126 (Figure 3) of the plasma chamber 122. In some embodiments, the one or more elements of the plasma chamber 202 that replace the one or more elements of the plasma chamber 122 have the same structure and/or function as that of the one or more elements of the plasma chamber 122. For example, the ESC 204 has the same dimensions as that of the ESC 126. As another example, the ESC 204 includes the same elements, e.g., a heater, a thermal insulator, a ceramic support, etc. as that of the ESC 126. As yet another example, the ESC 204 has the same characteristics, e.g., inductance, capacitance, resistance, a combination thereof, etc., as that of the ESC 126. As another example, both the ESC 204 and 126 are provided with power by an RF generator. As another example, both the plasma chambers 202 and 122 are of the same type. To illustrate, a TCP chamber is of a different type than an ICP chamber and both the TCP and the ICP chambers are of a different types than an ECR plasma chamber.

In some embodiments, the plasma chamber 122 is an example of the plasma chamber 1 and the plasma chamber 202 is an example of the plasma chamber 2.

In some embodiments, the plasma chamber 122 is decoupled from the RF transmission line 140 to couple the plasma chamber 202 to the RF transmission line 140. The wafer 154 is placed on an upper surface 206 of the ESC 204. The upper surface 206 faces the upper electrode 158.

In some embodiments, the relationship illustrated using the dashed line 103 (FIG. 1) is generated using the plasma chamber 202.

The probe 124 is embedded within the ESC 204 in a manner similar to that of embedding the probe 124 within the ESC 126. In several embodiments, instead of embedding the probe 124 within the ESC 204, the probe 124 is coupled to the ESC 204 and is located outside the ESC 204.

During performance of a no-plasma test using the plasma chamber 202, the host system 128 determines an amount of power within an RF signal and a frequency of the RF signal to supply to the plasma chamber 202. The amount of power and the frequency are sent as inputs via the DSP 130 to the DAS 132. The DAS 132 generates an RF signal having the amount of power and the frequency. The RF signal is supplied by the x MHz RF generator via the RF cable 134, the matchbox 136, and the RF transmission line 140 to the lower electrode of the ESC 204. When the process gas is supplied to the plasma chamber 202 and power is supplied to the lower electrode of the ESC 204 via the RF signal, plasma is generated within the plasma chamber 202.

As described above, in several embodiments in which a no-plasma test is performed, when power is supplied to the lower electrode of the ESC 204 via the RF signal and an amount of pressure less than a threshold or greater than a threshold is maintained within the plasma chamber 202, a minimal amount of plasma is struck within the plasma chamber.

During the no-plasma test, the probe 124 measures the variable associated with plasma of the plasma chamber 202 and sends the measurement to the host system 128. The processor of the host system 128 calculates a function of the variable from the measurement of the variable. The processor of the host system 128 determines a relationship, such as, for example, the relationship illustrated using the dashed line 103 of the graph 102 (FIG. 1), from the function of the variable and power supplied by the x MHz RF generator to the plasma chamber 202.

In some embodiments, instead of determining the relationship between the function of the variable and the supplied power during the no-plasma test, the processor of the host system 128 determines a relationship between the function of the variable and power delivered to the plasma chamber 202 during the no-plasma test. For example, the sensor 160 measures power reflected from the plasma chamber 202 towards the x MHz RF generator. The sensor 160 sends the reflected power measurement to the processor of the host system 128 via the DSP 130. The processor of the host system 128 calculates a difference between the supplied power and the reflected power to determine delivered power, and further determines the relationship, illustrated in the dashed line 103 of the graph 102, between the function of the variable and the delivered power.

When the plasma chamber 122 (FIG. 3) is the golden chamber, the processor of the host system 128 horizontally extends a line from the point 111 on the dashed line 103 (FIG. 1) corresponding to the variable function 1 to intersect the solid line 101 at the point 109. The processor of the host system 128 vertically extends a line from the intersected point 109 towards the x-axis to intersect the x-axis at the power value P1.

During subsequent processing of the wafer 154, instead of sending the power value P2 to the DAS 132 via the DSP 130 to achieve the variable function 1, the processor of the host system 128 identifies and sends the power value P1 to the DAS 132 via the DSP 130 to achieve the variable function 1. For example, the processor of the host system 128 identifies, e.g., reads, etc., from the storage device 186 (FIG. 4B) the power value P1 that is associated with the power value P2. The power values P1 and P2 are associated with each other as achieving the variable function 1. Upon receiving the power value P1, the DAS 132 generates an RF signal having the power value P1 and sends the RF signal via the RF cable 134, the matchbox 136, and the RF transmission line 140 to the lower electrode of the ESC 204. The power value P1 that is read from the storage device 186 and that is used to achieve the variable function 1, and the variable function 1 are examples of a processing condition.

In some embodiments, the power value P2 that is read from the storage device 186 and that is used to achieve the variable function 1, and the variable function 1 are examples of a processing condition.

When the RF signal is provided to the lower electrode of the ESC 204 and the process gas is supplied to the plasma chamber 202, plasma is stricken within the plasma chamber 202 to perform processing, e.g., etching, cleaning, depositing, etc., on the wafer 154. Also, when the RF signal having the power value P1 instead of the power value P2 is provided to the lower electrode of the ESC 204, power provided to the lower electrode is adjusted from the value P2 to the value P1 to achieve the variable function 1.

In some embodiments, the processor of the host system 128 determines the slope 2 from the relationship illustrated using the dashed line 103 of the graph 102 (FIG. 1). The processor of the host system 128 also determines the slope 1 from the relationship illustrated using the solid line 101 (FIG. 1). When the variable is voltage, the processor of the host system 128 calculates a ratio of slope 1 to slope 2 and multiplies the power value P2 with the ratio of slope 1 to slope 2 to achieve the power value P1 and to achieve the variable function 1.

During subsequent processing of the wafer 154, instead of controlling the x MHz RF generator to supply the power value P2 to achieve the variable function 1, the processor of the host system 128 controls the x MHz RF generator to supply the power value P1 to achieve the variable function 1. Upon receiving an indication from the processor of the host system 128 via the DSP 130 to generate an RF signal having the power value P1, the DAS 132 generates an RF signal having the power value P1 and supplies the RF signal via the RF cable 134, the matchbox 136, and the RF transmission line 140 to the lower electrode of the ESC 204.

In various embodiments in which the relationships illustrated in the graph 102 (FIG. 1) are relationships between the function of the variable and delivered power, during subsequent processing of the wafer 154, the processor of the host system 128 determines a supply power value to achieve the delivered power value of P1 and to achieve the variable function 1. The processor provides the supply power value to the DAS 132 via the DSP 130. The DAS 132 generates an RF signal having the supply power value corresponding to the delivered power value P1 to achieve the variable function 1. The RF signal is supplied by the x MHz RF generator via the RF cable 134, the matchbox 136, and the RF transmission line 140 to the lower electrode of the plasma chamber 202.

In some embodiments, instead of using the probe 124 within the ESC 204, the probe 124 is embedded within the RF tunnel 144 and/or is coupled to the RF rod 152 to measure variable at the RF rod 152. A computer-generated model of the RF rod 152, the RF strap 148, and the ESC 204 is used to determine a variable at the ESC 204. The variable at the ESC 204 is determined based on the variable measured using the probe 124 that is embedded within the RF tunnel 144 and impedance of elements of the RF rod 152, the RF strap 148, and the ESC 204. In several embodiments, instead of using a computer-generated model of the ESC 204, the variable at the ESC 204 is determined based on a computer-generated model of the RF rod 152 and the RF strap 148 and based on the variable measured using the probe 124 that is embedded within the RF tunnel 144.

In some embodiments, the probe 124 is coupled to a point between the x MHz RF generator and the wafer 154 and a computer-generated model of elements between the point and the plasma chamber 204 is used to determine a variable at the ESC 204. For example, the probe 124 is coupled to the RF cable 134 to determine the variable at the RF cable 134. Moreover, a computer-generated model of the matchbox 136, the RF transmission line 140, and the ESC 204 is used to determine the variable at the ESC 204. As another example, the probe 124 is coupled to the RF cable 134 to determine the variable at the RF cable 134. Moreover, a computer-generated model of the matchbox 136 and the RF transmission line 140 is used to determine the variable at the ESC 204.

It should be noted that in several embodiments, when the x MHz RF generator of the system 200 is used to supply power to the plasma chamber 202 to determine the relationship illustrated using the graph 102 or 104 (FIGS. 1 and 2), the y and z MHz RF generators are turned off. Similarly, when the y MHz RF generator of the system 200 is used to supply power to the plasma chamber 202 to determine the relationship illustrated using the graph 102 or 104, the x and z MHz RF generators are turned off. Also, when the z MHz RF generator of the system 200 is used to supply power to the plasma chamber 202 to determine the relationship illustrated using the graph 102 or 104, the x and y MHz RF generators are turned off.

Figures 6, 7:
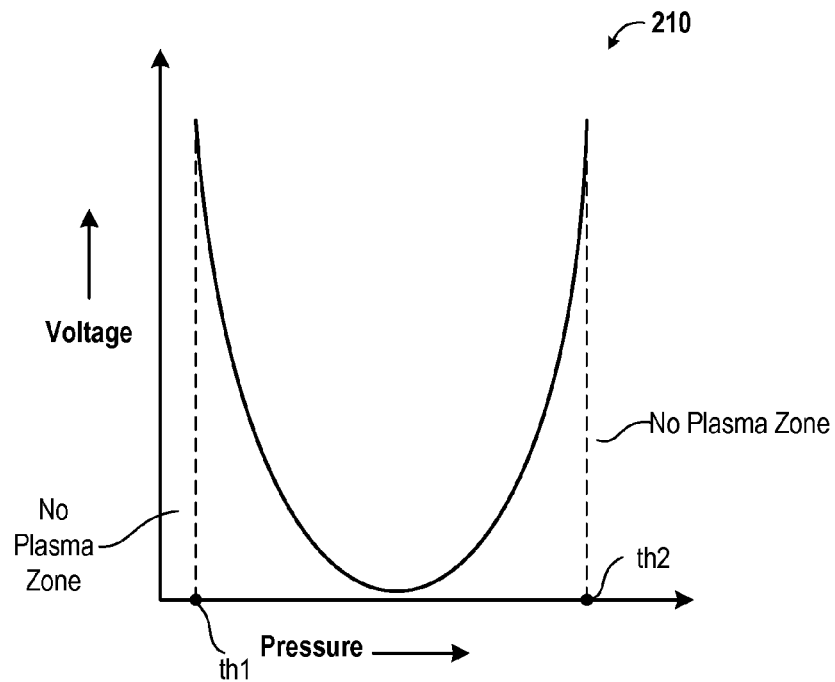
FIG. 6 is a diagram of a graph used to illustrate a relationship between voltage and pressure during a no-plasma test, in accordance with an embodiment described in the present disclosure.
FIG. 7 shows a recipe for performing chamber-to-chamber matching, in accordance with an embodiment described in the present disclosure.

FIG. 6 is a diagram of an embodiment of a graph 210 used to illustrate a relationship between voltage and pressure during a no-plasma test. The graph 210 plots voltage along a y-axis and plots pressure along an x-axis. When the pressure is below a threshold th1, a minimal amount of plasma is generated within a plasma chamber. In some embodiments, the pressure lower than the threshold th1 is achieved by not supplying the process gas or by supplying the process gas at an ultra low flow rate, e.g., less than 0.2 standard cubic centimeter per minute (sccm). Similarly, when the pressure is above a threshold th2, plasma is not generated or a minimal amount of plasma is generated within a plasma chamber. In some embodiments, the pressure above the threshold th2 is achieved by supplying a gas at an ultra high pressure, e.g., greater than or equal to 7 Torr, at a maximum achievable flow rate, etc. When plasma is not generated or a minimal amount of plasma is generated within a plasma chamber, the plasma chamber is used to perform the no-plasma test.

In some embodiments, the processor of the host system 128 controls a gas supply valve (not shown) that facilitates supply of a gas from a gas reservoir (not shown) to the gas inlets of the upper electrode 158 (FIGS. 3, 4A, and 5). For example, the processor controls a driver, e.g., a transistor, etc., that supplies a current to open or close the valve by an amount to control the supply of the gas. The control of the supply also allows the processor of the host system 128 to control the pressure within a plasma chamber in which the gas is supplied.

FIG. 7 shows an embodiment of a recipe 212 for performing chamber-to-chamber matching. In some embodiments, the recipe 212 is part of a database that is stored within the storage device 186 (FIG. 4B) of the host system 128 (FIGS. 3, 4A, and 5). For example, the recipe 212 may be stored in the form of a file within the storage device 186.

The recipe 212 includes pressure of a gas in a plasma chamber, power of an RF signal that is provided to a lower electrode of a plasma chamber, temperature maintained within the plasma chamber, frequency of the RF signal, and gap between the lower electrode and an upper electrode of the plasma chamber.

In some embodiments, the processor of the host system 128 (FIGS. 3, 4A, and 5) sends a frequency of an RF signal to an RF generator. A DSP of the RF generator receives the frequency and sends the frequency to a DAS of the RF generator. The DAS generates an RF signal having the frequency and supplies the RF signal to a plasma chamber.

In various embodiments, the upper electrode is located within an upper structure (not shown) that is may be raised up or down using a motor-driven screw mechanism (not shown). The processor of the host system 128 may control the motor-driven screw mechanism via a driver to move the upper structure up or down to change the gap between the upper and lower electrodes In several embodiments, a heater is included within an ESC and the heater is controlled by the processor of the host system 128 via a driver to change temperature within a plasma chamber.

In a number of embodiments, a heat transfer mechanism, e.g., a duct, etc., is provided within a plasma chamber and a flow of a cooling liquid is controlled by the processor of the host system 128 via a valve and a driver to change temperature within the plasma chamber.

The recipe 212 is applied by the processor of the host system 128 to control pressure within a plasma chamber, power of an RF signal provided to a lower electrode of the plasma chamber, temperature within the plasma chamber, frequency of the RF signal, and gap between the lower electrode and an upper electrode within the plasma chamber.

In various embodiments, the power shown in the recipe 212 is delivered power or supplied power.

As indicated in the recipe 212, the same recipe 212 is applied to the chamber 1, the chamber 2, and a chamber 3 (not shown). For example, the processor of the host system 128 controls pressure within the chambers 1, 2, and 3, power of RF signals provided to the chambers 1, 2, and 3, temperature within the chambers 1, 2, and 3, frequency of the RF signals, and gaps between lower and upper electrodes of the chambers 1, 2, and 3 to apply the same recipe 212 to the chambers 1, 2, and 3. As another example, the recipe 212 is applied to generate the relationship illustrated in the solid line 101 and the relationship illustrated in the dashed line 103 (FIG. 1).

In some embodiments, during application of the recipe 212 to the chamber 1, 2, or 3, pressure within the chamber, temperature within the chamber, frequency of an RF signal provided to the chamber, and gap between a lower electrode and an upper electrode of the chamber are maintained as constant, and power of the RF signal is varied from 5 megawatts to 10 megawatts to 15 megawatts to 20 megawatts.

In some embodiments, an amount of pressure of the recipe 212 maintained within the chambers 1, 2, and 3 is less than the threshold th1 or greater than the threshold th2.

It should be noted that the values of pressure, power, temperature, frequency, and gap are examples and should not be construed as limiting. For example, instead of 0.1 Torr pressure, a pressure ranging from 0 to 0.2 Torr is applied. As another example, instead of 5, 10, 15, and 20 megawatts, power is varied from 2 megawatts to 6 megawatts to 10 megawatts to 14 megawatts. As yet another example, any amount of power ranging from 1 to 50 megawatts is applied. As another example, instead of 28 MHz frequency, a frequency of 27 MHz is applied. As yet another example, when a 2 MHz RF generator is used, a frequency of 2 or 3 MHz may be applied. As another example, when a 60 MHz RF generator is used, a frequency between 55 MHz to 65 MHz is applied. As another example, instead of 2 centimeter, a gap between 1 and 3 centimeters is maintained.

FIG. 8 shows an embodiment of a recipe 212 for performing intra-chamber matching. As indicated in the recipe 212, the same recipe 212 is applied to the chamber 1 during the condition 1, the condition 2, and a condition 3 of the chamber 1. For example, the processor of the host system 128 controls pressure within the chamber 1 during the conditions 1 and 2, power of RF signals provided to the chamber 1 during the conditions 1 and 2, temperature within the chamber 1 during the conditions 1 and 2, frequency of the RF signals, and gaps between lower and upper electrodes of the chamber 1 during the conditions 1 and 2 to apply the same recipe 212 to the chamber 1 during the conditions 1, 2, and 3 of the chamber 1. As another example, the recipe 212 is applied to generate the relationship illustrated in the solid line 105 and the relationship illustrated in the dashed line 107 (FIG. 3).

In some embodiments, during application of the recipe 212 to the chamber 1 during the conditions 1, 2, and 3, pressure within the chamber 1, temperature within the chamber 1, frequency of an RF signal provided to the chamber 1, and gap between a lower electrode and an upper electrode of the chamber 1 are maintained as constant, and power of the RF signal is varied from 5 megawatts to 10 megawatts to 15 megawatts to 20 megawatts.

In various embodiments, the condition 3 occurs after occurrence of the condition 2. In various embodiments, after processing, e.g., etching, depositing, cleaning, supply of a gas, etc., on the wafer 154 (FIGS. 3, 4A, and 5) is performed within a plasma chamber during the condition 2, the plasma chamber achieves the condition 3.

Figure 9A:
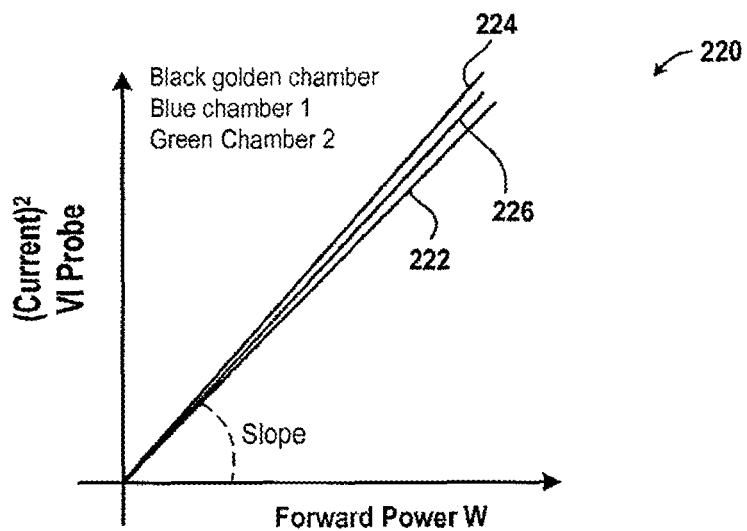
FIG. 9A is a diagram of a graph used to illustrate a difference in relationships between three plasma chambers, in accordance with an embodiment described in the present disclosure.

FIG. 9A is a diagram of an embodiment of a graph 220 used to illustrate a difference in relationships between three plasma chambers. As shown in the graph 220, there are three lines 222, 224, and 226. Each line 222, 224, and 226 shows a relationship between a square of current measured at an ESC of the plasma chamber and forward power, e.g., supplied power. The line 222 illustrates a relationship for the plasma chamber 1, the line 224 illustrates a relationship for the plasma chamber 2, and the line 226 illustrates a relationship for a golden chamber, which may be the chamber 3. As noted, slope of the line 222 is different than slope of the line 224. Also, slope of the line 224 is different than slopes of the lines 222 and 226.

The golden chamber provides a higher yield than the chambers 1 and 2. Relationships illustrated by the lines 222 and 224 are controlled to achieve the relationship illustrated by the line 226.

Figure 9B:
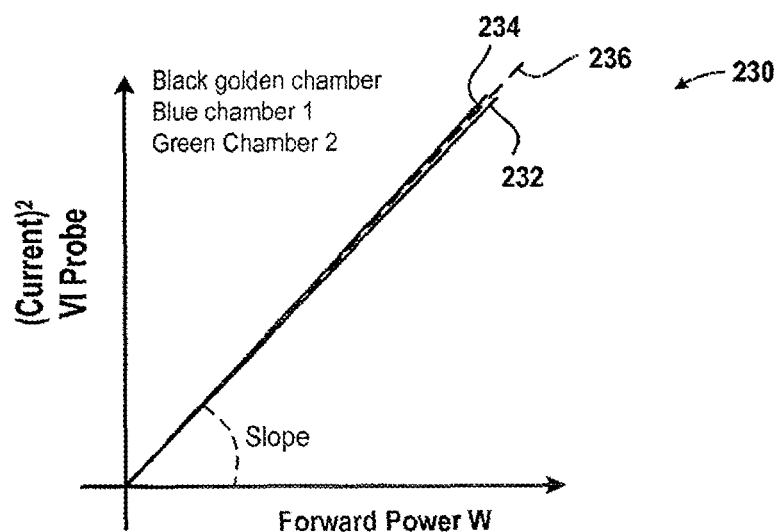
FIG. 9B is an embodiment of a graph used to illustrate a similarity in relationships between three plasma chambers after applying several embodiments described in the present disclosure.

FIG. 9B an embodiment of a graph 230 used to illustrate a similarity in relationships between three plasma chambers after applying several embodiments described in the present disclosure. As shown in the graph 230, there are three lines 232, 234, and 236. Each line 232, 234, and 236 shows a relationship between a square of current measured at an ESC of the plasma chamber and forward power, e.g., supplied power. The line 232 illustrates a relationship for the plasma chamber 1, the line 234 illustrates a relationship for the plasma chamber 2, and the line 236 illustrates a relationship for a golden chamber, which may be the chamber 3.

The line 236 is the same as the line 226 (FIG. 9A) except that the line 236 is dashed.

As shown, slope of the lines 232, 234, and 236 is the same or substantially the same.

It is further noted that although the above-described operations are described with reference to a parallel plate plasma chamber, e.g., a capacitively coupled plasma chamber, etc., in some embodiments, the above-described operations apply to other types of plasma chambers, e.g., a plasma chamber including an ICP reactor, a TCP reactor, conductor tools, dielectric tools, a plasma chamber including an ECR reactor, etc. For example, the x MHz RF generator and the y MHz RF generator are coupled to an inductor within the ICP plasma chamber.

It is also noted that although the operations above are described as being performed by the processor of the host system 128 (FIGS. 3, 4A, and 5), in some embodiments, the operations may be performed by one or more processors of the host system 128 or by multiple processors of multiple host systems.

It should be noted that although the above-described embodiments relate to providing an RF signal to the lower electrode of an ESC, and grounding the upper electrode 158 (FIGS. 3, 4A, and 5), in several embodiments, the RF signal is provided to the upper electrode 158 while the lower electrode is grounded.

It is also noted that although the above-described embodiments are described using an ESC, another type of chuck, e.g., a magnetic chuck, etc., may be used.

It is further noted that in several embodiments, the operations described above as performed by the processor of the host system 128 may be performed by the DSP 130 (FIGS. 3, 4A, and 5).

Embodiments described herein may be practiced with various computer system configurations including hand-held hardware units, microprocessor systems, microprocessor-based or programmable consumer electronics, minicomputers, mainframe computers and the like. The embodiments can also be practiced in distributed computing environments where tasks are performed by remote processing hardware units that are linked through a network.

With the above embodiments in mind, it should be understood that the embodiments can employ various computer-implemented operations involving data stored in computer systems. These operations are those requiring physical manipulation of physical quantities. Any of the operations described herein that form part of the embodiments are useful machine operations. The embodiments also relates to a hardware unit or an apparatus for performing these operations. The apparatus may be specially constructed for a special purpose computer. When defined as a special purpose computer, the computer can also perform other processing, program execution or routines that are not part of the special purpose, while still being capable of operating for the special purpose. In some embodiments, the operations may be processed by a general purpose computer selectively activated or configured by one or more computer programs stored in the computer memory, cache, or obtained over a network. When data is obtained over a network, the data may be processed by other computers on the network, e.g., a cloud of computing resources.

One or more embodiments can also be fabricated as computer-readable code on a non-transitory computer-readable medium. The non-transitory computer-readable medium is any data storage hardware unit that can store data, which can be thereafter be read by a computer system. Examples of the non-transitory computer-readable medium include hard drives, network attached storage (NAS), ROM, RAM, compact disc-ROMs (CD-ROMs), CD-recordables (CD-Rs), CD-rewritables (CD-RWs), magnetic tapes and other optical and non-optical data storage hardware units. The non-transitory computer-readable medium can include computer-readable tangible medium distributed over a network-coupled computer system so that the computer-readable code is stored and executed in a distributed fashion.

Although the method operations above were described in a specific order, it should be understood that other housekeeping operations may be performed in between operations, or operations may be adjusted so that they occur at slightly different times, or may be distributed in a system which allows the occurrence of the processing operations at various intervals associated with the processing, as long as the processing of the overlay operations are performed in the desired way.

One or more features from any embodiment may be combined with one or more features of any other embodiment without departing from the scope described in various embodiments described in the present disclosure.

Although the foregoing embodiments have been described in some detail for purposes of clarity of understanding, it will be apparent that certain changes and modifications can be practiced within the scope of the appended claims. Accordingly, the present embodiments are to be considered as illustrative and not restrictive, and the embodiments are not to be limited to the details given herein, but may be modified within the scope and equivalents of the appended claims.

The invention claimed is:

1. A method for performing chamber-to-chamber matching, the method comprising:
executing a first test within a first plasma chamber to measure a variable, wherein the first test is executed under a condition that places the first plasma chamber in a no plasma zone;
executing a second test within a second plasma chamber to measure the variable, wherein the first and second tests are executed based on one recipe, wherein the second test is executed under a condition that places the second plasma chamber in the no plasma zone;
determining a first relationship between the variable measured with the first test and power provided during the first test;
determining a second relationship between the variable measured with the second test and power provided during the second test; and
identifying power adjustment to apply to the second plasma chamber during a subsequent processing operation based on the first and second relationships, the power adjustment causing the second plasma chamber to perform the processing operation in a processing condition determined using the first plasma chamber, wherein during the processing operation, plasma is stricken within the second plasma chamber.

2. The method of claim 1, wherein the variable is current or voltage.

3. The method of claim 1, wherein the variable is measured during the first test using a probe coupled to a chuck, the chuck located within the first plasma chamber.

4. The method of claim 1, wherein the variable is measured during the second test using a probe coupled to a chuck, the chuck located within the second plasma chamber.

5. The method of claim 1, wherein the variable is measured during the first test using a probe, the probe coupled to a point between a radio frequency (RF) generator and a wafer, the RF generator coupled via an RF cable to an impedance matching circuit, the impedance matching circuit coupled via an RF transmission line to the first plasma chamber, the wafer placed on a surface of the chuck.

6. The method of claim 1, wherein the recipe includes a pressure within the first plasma chamber, a temperature within the first plasma chamber, power of an RF signal provided to the first plasma chamber, frequency of the RF signal, and gap between an upper electrode of the first plasma chamber and a lower electrode of the first plasma chamber.

7. The method of claim 1, wherein the recipe includes a pressure within the second plasma chamber, a temperature within the second plasma chamber, power of an RF signal provided to the second plasma chamber, frequency of the RF signal, and gap between an upper electrode of the second plasma chamber and a lower electrode of the second plasma chamber.

8. The method of claim 1, wherein the first relationship is a straight line.

9. The method of claim 1, wherein the second relationship is a straight line.

10. The method of claim 1, wherein the power adjustment is a difference between the power provided during the first test and the power provided during the second test.

11. The method of claim 1, wherein the subsequent processing operation includes etching, deposition, or cleaning of a wafer placed within the second plasma chamber.

12. The method of claim 1, wherein the processing condition includes a value of a function of the variable, the value achieved during the first test when an amount of the power is provided to the first plasma chamber during the first test.

13. The method of claim 1, wherein the first plasma chamber has a higher yield than the second plasma chamber.

14. The method of claim 1, wherein the condition that places the first plasma chamber in the no plasma zone includes an amount of pressure within the first plasma chamber to avoid striking plasma within the first plasma chamber, and wherein the condition that places the second plasma chamber in the no plasma zone includes an amount of pressure within the second plasma chamber to avoid striking plasma within the second plasma chamber.

15. A method for performing intra-chamber matching, the method comprising:
executing a first test to measure a variable associated with a plasma chamber, the plasma chamber is in a first condition during execution of the first test, wherein during execution of the first test, the plasma chamber is operated to be in a no plasma zone;
executing a second test to measure the variable associated with the plasma chamber, the plasma chamber is in a second condition during execution of the second test, wherein during execution of the second test, the plasma chamber is operated to be in the no plasma zone;
determining a first relationship between the variable measured using the first test and power provided during the first test;
determining a second relationship between the variable measured using the second test and power provided during the second test; and
identifying power adjustment to apply to the plasma chamber during a subsequent processing operation based on the first and second relationships, the power adjustment causing the plasma chamber to perform the processing operation in a processing condition, the processing condition determined when the plasma chamber is in the first condition, wherein during the processing operation, plasma is stricken within the plasma chamber.

16. The method of claim 15, wherein the second condition occurs in time after occurrence of the first condition.

17. The method of claim 15, wherein the second condition occurs after performing processing on a wafer placed within the plasma chamber, the first condition occurring before performing the processing.

18. A plasma system for performing chamber-to-chamber matching, the plasma system comprising:
a first plasma chamber used to execute a first test to measure a variable, wherein the first plasma chamber is configured to operate in a no plasma zone during execution of the first test;
a radio frequency (RF) transmission line coupled to the first plasma chamber for communicating an RF signal to the first plasma chamber;
an impedance matching circuit coupled to the RF transmission line;
an RF generator coupled to the impedance matching circuit for supplying an RF signal to the impedance matching circuit;
a second plasma chamber used to execute a second test to measure the variable, wherein the first and second tests are executed based on one recipe, wherein the second test is executed after decoupling the first plasma chamber from the RF transmission line and coupling the second plasma chamber to the RF transmission line, wherein the second plasma chamber is configured to operate in the no plasma zone during execution of the second test; and
a host system including a processor, the host system coupled to the RF generator, the processor configured to:
determine a first relationship between the variable measured with the first test and power provided during the first test;
determine a second relationship between the variable measured with the second test and power provided during the second test; and
identify power adjustment to apply to the second plasma chamber during a subsequent processing operation based on the first and second relationships, the power adjustment causing the second plasma chamber to perform the processing operation in a processing condition determined using the first plasma chamber.

19. A plasma system for performing intra-chamber matching, the plasma system comprising:
a plasma chamber used to execute a first test to measure a variable, the plasma chamber is in a first condition during execution of the first test, wherein the plasma chamber is configured to operate in a no plasma zone during execution of the first test,
the plasma chamber used to execute a second test to measure the variable, the plasma chamber is in a second condition during execution of the second test, wherein the plasma chamber is configured to operate in the no plasma zone during execution of the second test;
a radio frequency (RF) transmission line coupled to the plasma chamber for communicating an RF signal to the plasma chamber;
an impedance matching circuit coupled to the RF transmission line;
an RF generator coupled to the impedance matching circuit for supplying an RF signal to the impedance matching circuit; and
a host system including a processor, the host system coupled to the RF generator, the processor configured to:
determine a first relationship between the variable measured using the first test and power provided during the first test;
determine a second relationship between the variable measured using the second test and power provided during the second test; and
identify power adjustment to apply to the plasma chamber during a subsequent processing operation based on the first and second relationships, the power adjustment causing the plasma chamber to perform the processing operation in a processing condition, the processing condition determined when the plasma chamber is in the first condition.

20. The plasma system of claim 18, wherein the first plasma chamber includes a first chuck, wherein the variable is measured during the first test using a probe coupled to the first chuck, wherein the second plasma chamber includes a second chuck, wherein the variable is measured during the second test using a probe coupled to the second chuck.

21. The plasma system of claim 18, wherein the first plasma chamber includes a chuck, wherein the variable is measured during the first test using a probe, the probe coupled to a point between the RF generator and a wafer placed on a surface of the chuck.

22. The plasma system of claim 18, wherein the first plasma chamber has a higher yield than the second plasma chamber.

23. The plasma system of claim 19, wherein the plasma chamber includes a chuck, wherein the variable is measured during each of the first and second tests using a probe coupled to the chuck.

24. The plasma system of claim 19, wherein the plasma chamber includes a chuck, wherein the variable is measured during each of the first and second tests using a probe, the probe coupled to a point between the RF generator and a wafer placed on a surface of the chuck.

* * * * *